(12) United States Patent
Yamazaki

(10) Patent No.: US 9,041,026 B2
(45) Date of Patent: May 26, 2015

(54) LIGHT-EMITTING UNIT, LIGHT-EMITTING DEVICE, LIGHTING DEVICE, AND METHOD FOR MANUFACTURING LIGHT-EMITTING UNIT

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 154 days.

(21) Appl. No.: 13/337,631

(22) Filed: Dec. 27, 2011

(65) Prior Publication Data

US 2012/0161167 A1 Jun. 28, 2012

(30) Foreign Application Priority Data

Dec. 28, 2010 (JP) ................................. 2010-293944
Feb. 4, 2011 (JP) ................................. 2011-022567

(51) Int. Cl.
*H01L 33/00* (2010.01)
*H01L 27/32* (2006.01)

(52) U.S. Cl.
CPC ........ *H01L 27/3204* (2013.01); *H01L 27/3283* (2013.01)

(58) Field of Classification Search
USPC .................... 257/93, E27.121, 40, 88–89, 91, 257/E33.062, E33.065; 313/307
See application file for complete search history.

(56) References Cited

U.S. PATENT DOCUMENTS

| | | | |
|---|---|---|---|
| 6,133,581 A | 10/2000 | Terao et al. | |
| 7,737,629 B2 | 6/2010 | Okuyama et al. | |
| 7,888,864 B2 | 2/2011 | Young | |
| 8,552,440 B2 | 10/2013 | Yamazaki | |
| 8,575,631 B2 | 11/2013 | Yamazaki | |
| 2006/0220544 A1 | 10/2006 | Okuyama et al. | |
| 2008/0224606 A1 | 9/2008 | Kawai et al. | |
| 2010/0117523 A1* | 5/2010 | Tchakarov | 313/504 |
| 2010/0277403 A1* | 11/2010 | Chao et al. | 345/80 |
| 2011/0037054 A1* | 2/2011 | Shieh et al. | 257/40 |
| 2012/0062108 A1* | 3/2012 | Mima | 313/504 |

FOREIGN PATENT DOCUMENTS

| | | |
|---|---|---|
| CN | 1893105 A | 1/2007 |
| CN | 101267702 A | 9/2008 |
| EP | 1 970 960 A2 | 9/2008 |

(Continued)

OTHER PUBLICATIONS

Copening U.S. Appl. No. 13/371,055.*
Copending U.S. Appl. No. 13/331,108.*
International Search Report re application No. PCT/JP2011/079571, dated Jan. 31, 2012.
Written Opinion re application No. PCT/JP2011/079571, dated Jan. 31, 2012.

*Primary Examiner* — Yu-Hsi D Sun
*Assistant Examiner* — Lauren R Bell
(74) *Attorney, Agent, or Firm* — Husch Blackwell LLP

(57) ABSTRACT

A light-emitting unit with small energy loss is provided. Further, a light-emitting unit with high reliability is provided. A light-emitting unit is provided in the following manner: a separation layer including a leg portion and a stage portion, which protrudes over an electrode is formed so that a projected area of the stage portion is larger than that of the leg portion; a layer containing a light-emitting organic compound, an upper electrode of the first light-emitting element, and an upper electrode of the second light-emitting element are formed; and the upper electrode of the first light-emitting element is electrically connected to a lower electrode of the second light-emitting element in a region overlapping with the stage portion of the separation layer.

11 Claims, 20 Drawing Sheets

(56) References Cited

FOREIGN PATENT DOCUMENTS

| JP | 2000-82588 | 3/2000 | | |
| JP | 2005-235491 | 9/2005 | | |
| JP | 2006-49853 | 2/2006 | | |
| JP | 2006-310289 | 11/2006 | | |
| JP | 2008-227326 | 9/2008 | | |
| JP | 2010277757 A | * | 12/2010 |
| KR | 10-0760347 | 9/2007 | | |
| KR | 10-2008-0084610 | 9/2008 | | |
| WO | WO 2004/044987 A2 | 5/2004 | | |

* cited by examiner

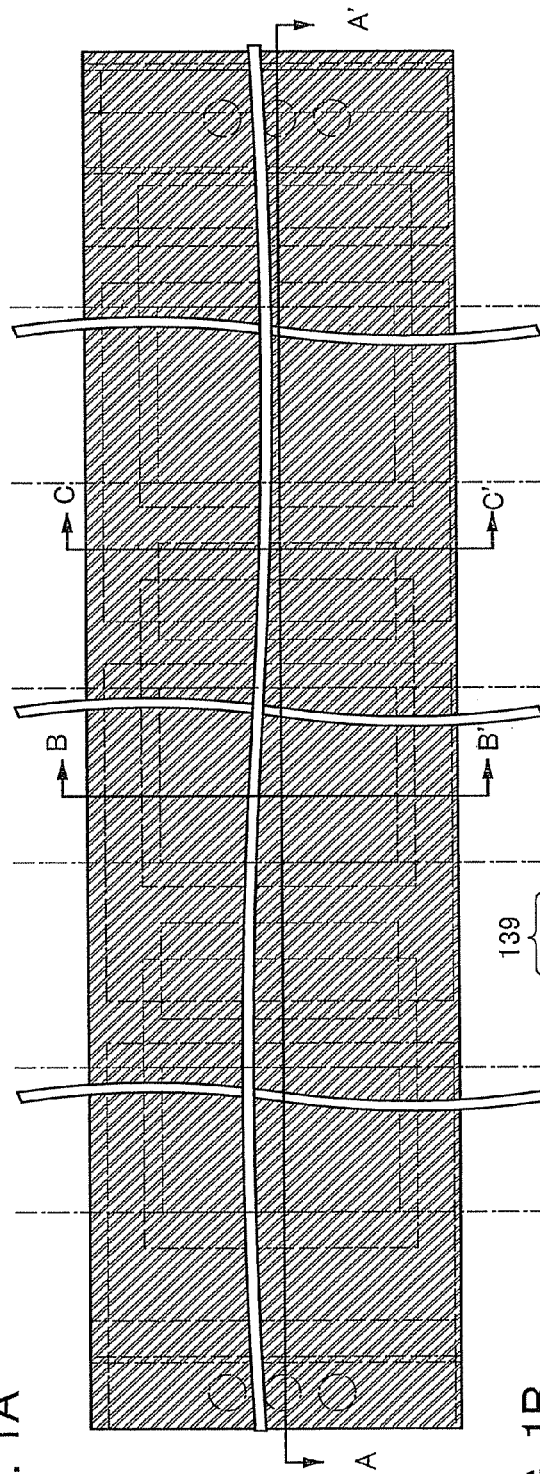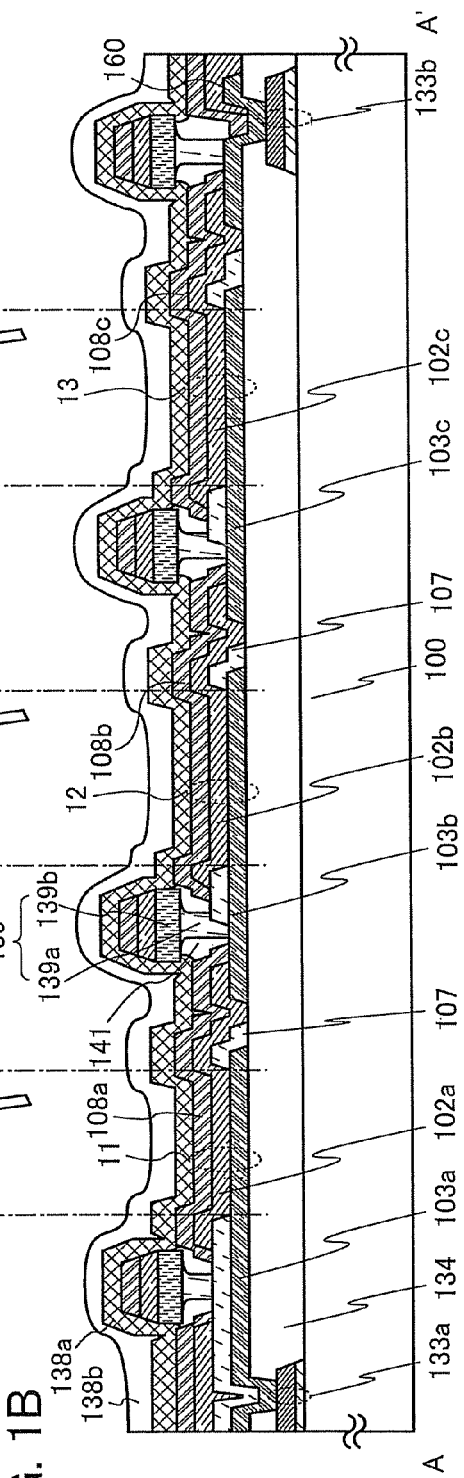

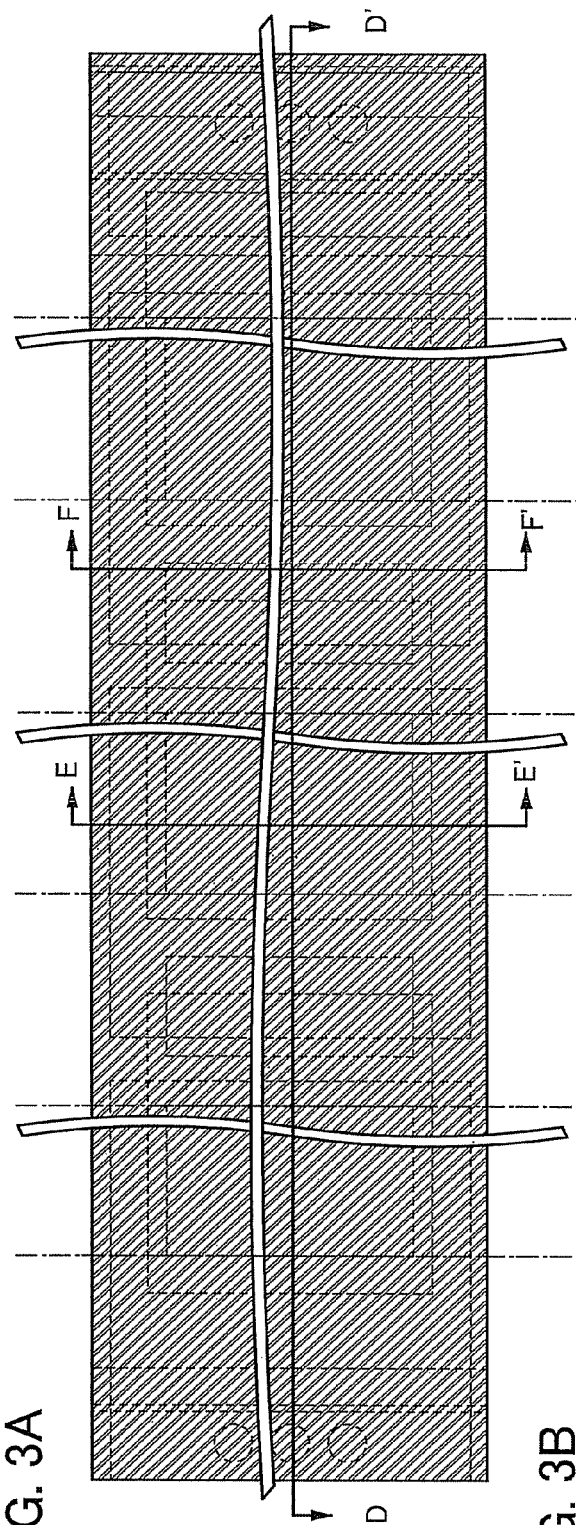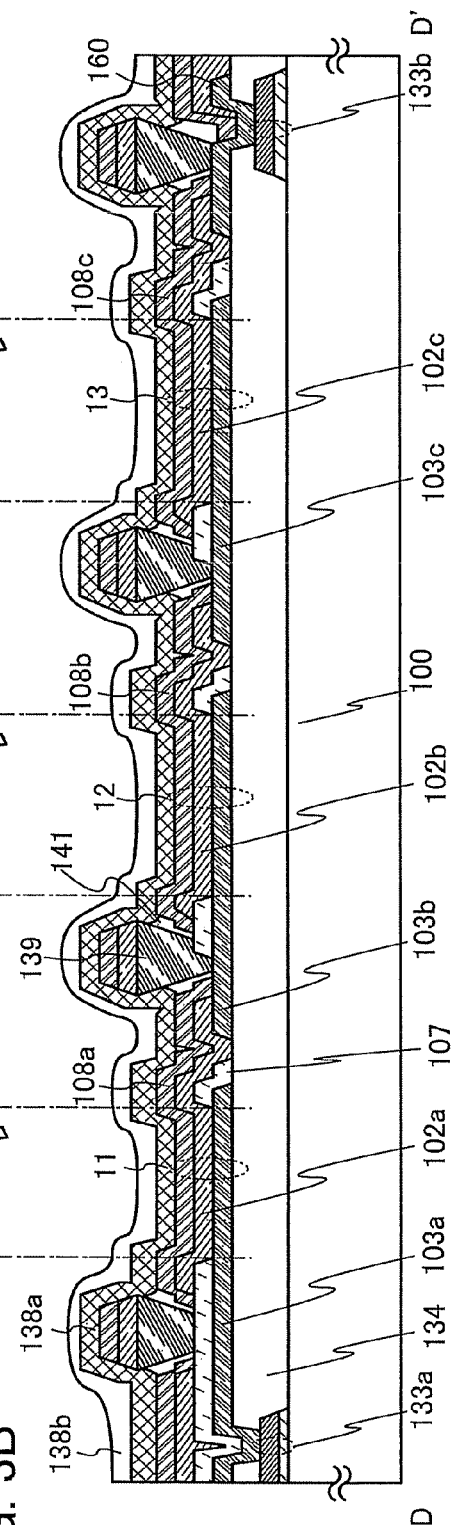

LIGHT-EMITTING UNIT, LIGHT-EMITTING DEVICE, LIGHTING DEVICE, AND METHOD FOR MANUFACTURING LIGHT-EMITTING UNIT

TECHNICAL FIELD

One embodiment of the present invention relates to a light-emitting unit including a plurality of light-emitting elements utilizing organic electroluminescence (EL) (such a light-emitting element is also referred to as an organic EL element). One embodiment of the present invention relates to a light-emitting device and a lighting device each including the light-emitting unit.

BACKGROUND ART

An organic EL element has been actively researched and developed. In the fundamental structure of the organic EL element, a layer containing a light-emitting organic compound is interposed between a pair of electrodes. By applying voltage to this element, light can be emitted from the light-emitting organic compound.

The organic EL element can be faulted into a film; thus, a large-area element can be easily formed. Therefore, the organic EL element has a high utility value as a surface light source that can be applied to lighting or the like.

For example, a lighting device including an organic EL element is disclosed in Patent Document 1.

REFERENCE

[Patent Document 1] Japanese Published Patent Application No. 2009-130132

DISCLOSURE OF INVENTION

An organic EL element can be driven at relatively low voltage, specifically, approximately 3 V to several tens of volts. Therefore, the organic EL element is suitable as a light-emitting element for use in which a power source with low output voltage (e.g., a battery) is used as a power source, specifically, a light-emitting element for portable use.

However, the voltage supplied from a home power line or the like is approximately 100 V to 240 V. Thus, the difference between the voltage and the driving voltage of the organic EL element is too big. In view of the above, a converter or the like which converts power supply voltage is needed when such a high voltage power source is used. In that case, a problem of energy loss by the converter arises. For example, the conversion efficiency of a converter which converts voltage tends to be reduced with an increase in the difference between input voltage and output voltage. Specifically, when power supply voltage from a power line, which is approximately 100 V to 240 V, is reduced to the driving voltage of the organic EL element, which is approximately 3 V to several tens of volts, a problem that a large amount of energy is lost by the converter arises.

Further, an organic EL element includes a layer containing a light-emitting organic compound between a lower electrode and an upper electrode. As a method for stacking the layer containing an organic compound and the upper electrode in that order over the lower electrode formed over an insulating substrate, a vacuum evaporation method is given, for example. As a method for forming an island-shaped layer using a vacuum evaporation method, a method using a metal mask (also referred to as a shadow mask), which is a metal plate provided with an opening, is known. The metal mask is provided between a substrate and an evaporation source to be in contact with the substrate, and evaporation is performed on the substrate through the opening in the metal mask, whereby evaporation can be performed with a shape depending on the shape of the opening. Note that when the distance between a metal mask and a substrate is short, an island-shaped layer can be formed with a clear shape depending on an opening, in other words, a shape whose periphery is less obscured.

However, the probability of the occurrence of problems becomes high when a metal mask is used in contact with a substrate. For example, a surface of the substrate is damaged by an edge of an opening in the metal mask in some cases. Specifically, at the time of making the metal mask to be in contact with the substrate, the metal mask rubs the surface of the substrate, so that another layer, which is already formed on the substrate, is broken in some cases. Further, dust attached to the metal mask (including a small foreign substance referred to as a particle) is transferred from the metal mask to the substrate in some cases.

The present invention is made in view of the foregoing technical background. Therefore, an object of one embodiment of the present invention is to provide a light-emitting unit with a small energy loss. An object of one embodiment of the present invention is to provide a light-emitting unit with high reliability.

An object of one embodiment of the present invention is to provide a light-emitting device including a light-emitting unit with a small energy loss. An object of one embodiment of the present invention is to provide a light-emitting device including a light-emitting unit with high reliability.

An object of one embodiment of the present invention is to provide a lighting device including a light-emitting unit with a small energy loss. An object of one embodiment of the present invention is to provide a lighting device including a light-emitting unit with high reliability.

Further, an object of one embodiment of the present invention is to provide a method for manufacturing a light-emitting unit with a small energy loss. Furthermore, an object of one embodiment of the present invention is to provide a method for manufacturing a light-emitting unit with high reliability.

In order to drive an organic EL element with energy loss reduced as much as possible in the usage environment where high power supply voltage is supplied, the organic EL element may be driven at high power supply voltage without using a converter which causes the energy loss, or power supply voltage may be converted into power supply voltage at which the conversion efficiency of the converter is not impaired and the driving voltage of the organic EL element may be adjusted to the power supply voltage. Specifically, a light-emitting unit in which organic EL elements are connected in series to increase the driving voltage may be formed and may be connected to high power supply voltage through a converter.

However, in the light-emitting unit in which the plurality of organic EL elements are connected in series, the whole light-emitting unit is turned off when one of the connection portions of the organic EL elements is disconnected. In other words, the defect percentage of a lighting device including the light-emitting unit is the product of the connection portions of the light-emitting elements, which makes it difficult for the lighting device to have reliability.

In view of the above, in a light-emitting unit in which a plurality of organic EL elements (hereinafter simply referred to as light-emitting elements) are connected in series, attention is focused on a structure of a portion where an upper electrode of the light-emitting element is connected to a lower electrode of the adjacent light-emitting element and a metal mask causing defects. Then, a structure is considered, in which an upper electrode of a first light-emitting element is connected to a lower electrode of a second light-emitting element without the use of a metal mask. Specifically, a first partition wall covering an edge portion of the lower electrode of the first light-emitting element is provided; a separation layer including a leg portion and a stage portion, which protrudes over the electrode so that a projected area of the stage portion is larger than that of the leg portion, and a second partition wall, which is in contact with one side of the separation layer, are provided over the lower electrode of the second light-emitting element; and a layer containing a light-emitting organic compound and the upper electrode of the first light-emitting element and an upper electrode of the second light-emitting element, which overlap with the layer, are formed without the use of a metal mask, the upper electrode of the first light-emitting element is provided so as to extend beyond the edge portion of the lower electrode of the first light-emitting element with the first partition wall interposed therebetween, and is electrically connected to the lower electrode of the second light-emitting element in a region overlapping with the stage portion of the separation layer. With such a structure, the above problems have been solved.

Note that in this specification, a lower electrode and an upper electrode of a first light-emitting element are also referred to as a first electrode and a second electrode, respectively. A lower electrode and an upper electrode of a second light-emitting element are also referred to as a third electrode and a fourth electrode, respectively.

One embodiment of the present invention is a light-emitting unit including a first light-emitting element, a second light-emitting element over an insulating surface, and a separation layer. The first light-emitting element includes an island-shaped first electrode, a second electrode overlapping with the first electrode, and a layer containing a light-emitting organic compound between the first electrode and the second electrode. An edge portion of the first electrode is covered with a first insulating partition wall. The second light-emitting element includes an island-shaped third electrode, a fourth electrode overlapping with the third electrode, and a layer containing a light-emitting organic compound between the third electrode and the fourth electrode. A second insulating partition wall is provided over the third electrode. The first electrode and the third electrode are formed from the same layer with a property of transmitting light emitted from the light-emitting organic compound. The first partition wall and the second partition wall are formed from the same layer. The second electrode and the fourth electrode are formed from the same layer. The separation layer includes a leg portion and a stage portion over the leg portion. The stage portion is provided to protrude so that a projected area thereof to the third electrode is larger than that of the leg portion. One edge portion of the second partition wall is covered with the layer containing the light-emitting organic compound in the second light-emitting element, and the other edge portion of the second partition wall is in contact with the separation layer. The second electrode is provided so as to extend beyond the edge portion of the first electrode with the first partition wall interposed therebetween, and is electrically connected to the third electrode in a region overlapping with the stage portion.

According to the above embodiment of the present invention, the second electrode that is an upper electrode of the first light-emitting element is provided so as to extend beyond the edge portion of the first electrode, with the first insulating partition wall provided for the edge portion of the first electrode that is a lower electrode interposed therebetween, and is electrically connected to the third electrode that is a lower electrode of the second light-emitting element. Note that a region where the second electrode is electrically connected to the third electrode is included in a region where the stage portion of the separation layer protrudes over and overlaps with the third electrode. In this region, the second electrode formed by promoting entrance is formed beyond an edge portion of the layer containing a light-emitting organic compound to be in contact with the third electrode. For example, the layer containing a light-emitting organic compound formed by suppressing entrance is not formed over the third electrode in this region, and only the second electrode formed by promoting entrance is formed in contact with the third electrode.

Consequently, the light-emitting unit with high driving voltage, in which the first light-emitting element and the second light-emitting element are connected in series, can be provided. In addition, by providing the first partition wall, a short circuit between the first electrode and the second electrode can be prevented at a step portion formed at the edge portion of the first electrode. Moreover, by providing the second partition wall, a short circuit between the third electrode and the fourth electrode can be prevented at a region where the third electrode and the fourth electrode overlap with the stage portion. In addition, with a structure capable of being manufactured without using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a maintenance cost such as cleaning.

Further, one embodiment of the present invention is the above light-emitting unit in which a space is provided on the leg portion side of a straight line connecting a point where the leg portion is in contact with the third electrode and an edge of the stage portion protruding beyond the leg portion, in a cross section of the separation layer.

According to the above embodiment of the present invention, in a region where the third electrode overlaps with the stage portion, the second electrode that is an upper electrode of the first light-emitting element is electrically connected to the third electrode that is a lower electrode of the second light-emitting element; therefore, the first light-emitting element and the second light-emitting element are connected in series. In particular, it is preferable to provide a space on the leg portion side of a straight line connecting a point where the leg portion of the separation layer is in contact with the third electrode and an edge of the stage portion protruding beyond the leg portion. With such a structure, in other words, with a structure in which the stage portion and the leg portion are connected to each other with a curved portion provided therebetween, entrance of a conductive film to be the second electrode formed by promoting entrance is larger than that of the layer containing a light-emitting organic compound formed by suppressing entrance; therefore, the second electrode can be easily electrically connected to the third electrode. As a result, the light-emitting unit with high reliability can be provided.

Further, one embodiment of the present invention is the above light-emitting unit in which the first partition wall covers the edge portion of the first electrode and an edge portion of the third electrode, and the second electrode is provided so as to extend beyond the edge portion of the first electrode and the edge portion of the third electrode with the first partition wall interposed therebetween and is electrically connected to the third electrode in the region overlapping with the stage portion.

According to the above embodiment of the present invention, the second electrode which is an upper electrode of the first light-emitting element is provided so as to extend beyond the edge portion of the first electrode and the edge portion of the third electrode with the first insulating partition wall provided to cover the edge portions of the first electrode and the third electrode which are lower electrodes interposed therebetween, and the second electrode is electrically connected to third electrode in the region overlapping with the stage portion. With such a structure, a short circuit between the first electrode and the second electrode is less likely to occur at a step portion formed at the edge portion of the first electrode, and the second electrode is difficult to break at a step portion formed at the edge portion of the third electrode; therefore, the light-emitting unit with high reliability can be provided.

Further, one embodiment of the present invention is a light-emitting unit including a first light-emitting element and a second light-emitting element over an insulating surface, an auxiliary wiring, and a separation layer. The first light-emitting element includes an island-shaped first electrode, a second electrode overlapping with the first electrode, and a layer containing a light-emitting organic compound between the first electrode and the second electrode. An edge portion of the first electrode is covered with a first insulating partition wall. The second light-emitting element includes an island-shaped third electrode, a fourth electrode overlapping with the third electrode, and a layer comprising a light-emitting organic compound between the third electrode and the fourth electrode. A second insulating partition wall is provided over the third electrode. The auxiliary wiring is electrically connected to the third electrode. The separation layer overlaps with the auxiliary wiring and the second partition wall. The first electrode and the third electrode are formed from the same layer with a property of transmitting light emitted from the light-emitting organic compound. The first partition wall and the second partition wall are formed from the same layer. The second electrode and the fourth electrode are formed from the same layer. The separation layer includes a leg portion and a stage portion over the leg portion. The stage portion is provided to protrude so that a projected area thereof to the auxiliary wiring is larger than that of the leg portion. One edge portion of the second partition wall is covered with the layer comprising the light-emitting organic compound in the second light-emitting element, and the other edge portion of the second partition wall is in contact with the separation layer. The second electrode is provided so as to extend beyond the edge portion of the first electrode with the first partition wall interposed therebetween, and is electrically connected to the auxiliary wiring in a region overlapping with the stage portion.

According to the above embodiment of the present invention, the second electrode that is an upper electrode of the first light-emitting element is provided so as to extend beyond the edge portion of the first electrode, with the first insulating partition wall provided for the edge portion of the first electrode that is a lower electrode interposed therebetween, and is electrically connected to the auxiliary wiring. Note that a region where the second electrode is connected to the auxiliary wiring is included in a region where the stage portion of the separation layer protrudes over the auxiliary wiring. In this region, the second electrode formed by promoting entrance is formed beyond an edge portion of the layer containing a light-emitting organic compound to be in contact with the auxiliary wiring. For example, the layer containing a light-emitting organic compound formed by suppressing entrance is not formed and only the second electrode formed by promoting entrance is formed in contact with the auxiliary wiring. Moreover, the second electrode is electrically connected to the third electrode through the auxiliary wiring containing a metal.

Consequently, the light-emitting unit with high driving voltage, in which the first light-emitting element and the second light-emitting element are connected in series, can be provided. In addition, by providing the first partition wall, a short circuit between the first electrode and the second electrode can be prevented at a step portion formed at the edge portion of the first electrode. Moreover, by providing the second partition wall, a short circuit between the third electrode and the fourth electrode can be prevented at a region where the third electrode and the fourth electrode overlap with the stage portion. In addition, with a structure capable of being manufactured without using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a maintenance cost such as cleaning. In addition, the non-uniformity of the potential in the third electrode can be reduced without blocking light emitted from the light-emitting organic compound by the auxiliary wiring, so that the second light-emitting element can uniformly emit light. Moreover, the occurrence of poor connection can be prevented at the interface between the second electrode and the third electrode having a property of transmitting light emitted from the light-emitting organic compound.

Further, one embodiment of the present invention is the above light-emitting unit in which a space is provided on the leg portion side of a straight line connecting a point where the leg portion is in contact with the auxiliary wiring and an edge of the stage portion protruding beyond the leg portion, in a cross section of the separation layer.

According to the above embodiment of the present invention, the second electrode that is an upper electrode of the first light-emitting element is electrically connected to the auxiliary wiring, in a region overlapping with the protruded stage portion; therefore, the first light-emitting element and the second light-emitting element are connected in series. In particular, a space is provided on the leg portion side of a straight line connecting a point where the leg portion of the separation layer is in contact with the auxiliary wiring and an edge of the stage portion protruding beyond the leg portion. With such a structure, in other words, with a structure in which the stage portion and the leg portion are connected to each other with a curved portion provided therebetween, entrance of a conductive film to be the second electrode formed by promoting entrance is larger than that of the layer containing a light-emitting organic compound formed by suppressing entrance; therefore, the second electrode can be easily electrically connected to the auxiliary wiring. As a result, the light-emitting unit with high reliability can be provided.

Further, one embodiment of the present invention is a light-emitting unit in which the first partition wall covers the edge portion of the first electrode and an edge portion of the auxiliary wiring, and the second electrode is provided so as to extend beyond the edge portion of the first electrode and the edge portion of the auxiliary wiring with the first partition wall interposed therebetween and is electrically connected to the auxiliary wiring in the region overlapping with the stage portion.

According to the above embodiment of the present invention, the second electrode that is an upper electrode of the first light-emitting element is provided so as to extend beyond the edge portion of the first electrode, with the first insulating partition wall provided for the edge portion of the first electrode that is a lower electrode interposed therebetween, and is provided so as to extend beyond the edge portion of the auxiliary wiring, with the first insulating partition wall provided for the edge portion of the auxiliary wiring interposed therebetween. Thus, the second electrode is electrically connected to the third electrode that is a lower electrode of the second light-emitting element. With such a structure, a short circuit between the first electrode and the second electrode is less likely to occur at a step portion formed at the edge portion of the first electrode, and the second electrode is difficult to break at a step portion formed at the edge portion of the auxiliary wiring; therefore, the light-emitting unit with high reliability can be provided.

Further, one embodiment of the present invention is the above light-emitting unit including a first side wiring provided to overlap with the layer comprising the organic compound and the second electrode in the first light-emitting element, and to be in contact with the first electrode, and/or a second side wiring provided to overlap with the layer comprising the organic compound and the fourth electrode in the second light-emitting element, and to be in contact with the third electrode. The first side wiring comprises a metal with higher conductivity than the first electrode, and the second side wiring comprises a metal with higher conductivity than the third electrode.

According to the above embodiment of the present invention, the side wiring which contains a metal whose conductivity is higher than that of the first electrode and/or the third electrode is provided in contact with the first electrode and/or the third electrode. Thus, the non-uniformity of the potential in the first electrode and/or the third electrode can be reduced, so that the first light-emitting element and/or the second light-emitting element can emit light uniformly.

One embodiment of the present invention is a light-emitting device which includes a converter and in which the light-emitting unit is driven with the output voltage of the converter.

According to the above embodiment of the present invention, a light-emitting device including a light-emitting unit with a small energy loss can be provided. A light-emitting device including a light-emitting unit with high reliability can be provided.

One embodiment of the present invention is a lighting device including the light-emitting unit.

According to the above embodiment of the present invention, a lighting device including a light-emitting unit with a small energy loss can be provided. A lighting device including a light-emitting unit with high reliability can be provided.

Further, one embodiment of the present invention is a method for manufacturing a light-emitting unit including the following steps: forming an island-shaped first electrode and an island-shaped third electrode, which are to be lower electrodes, over an insulating surface; forming a first partition wall covering an edge portion of the first electrode, and a second partition wall over the third electrode; forming a first photosensitive resin over the third electrode, and a second photosensitive resin having sensitivity different from that of the first photosensitive resin over the first photosensitive resin; selectively exposing and developing the first photosensitive resin and the second photosensitive resin to form a leg portion, which is in contact with the third electrode, and the second partition wall using the first photosensitive resin and to form a stage portion, which protrudes beyond the leg portion over the third electrode, using the second photosensitive resin, and forming a separation layer comprising the leg portion and the stage portion; forming a layer comprising a light-emitting organic compound in a region overlapping with the stage portion of the third electrode by suppressing entrance; and forming a conductive film, which is to be an upper electrode comprising the second electrode and the fourth electrode, in the region overlapping with the stage portion of the third electrode by promoting entrance so that the second electrode is in contact with the third electrode.

According to one embodiment of the present invention, a layer, in which two kinds of photosensitive resins having different photosensitivities are stacked, is subjected to selective exposure and development, whereby the separation layer is formed. In addition, the layer containing a light-emitting organic compound is formed while entrance of the layer is prevented, and the upper electrode is formed while entrance of the upper electrode is promoted. In such a manner, the separation layer including the stage portion protruding over the third electrode beyond the leg portion can be easily formed. In addition, the layer containing the light-emitting organic compound is formed between the lower electrodes (the first electrode and the third electrode) and the upper electrodes (the second electrode and the fourth electrode) without the use of a metal mask, and the second electrode and the third electrode can be electrically connected to each other in a region where the third electrode overlaps with the stage portion. Further, since a metal mask is not used in the manufacturing method, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a maintenance cost such as cleaning.

Note that a light-emitting element described in this specification has a bottom emission structure. Accordingly, a lower electrode such as a first electrode has a property of transmitting light emitted from a light-emitting organic compound. Note that the present invention can be used for a light-emitting element having a top emission structure or a dual emission structure. In the case of a light-emitting element having a top emission structure, an upper electrode such as a second electrode has a property of transmitting light emitted from a light-emitting organic compound. In the case of a light-emitting element having a dual emission structure, a lower electrode and an upper electrode have a property of transmitting light emitted from a light-emitting organic compound.

Note that in this specification, the first partition wall and the second partition wall which are described above are collectively referred to as a partition wall in some cases.

According to one embodiment of the present invention, a light-emitting unit with a small energy loss can be provided. A light-emitting unit with high reliability can be provided.

A light-emitting device including a light-emitting unit with a small energy loss can be provided. A light-emitting device including a light-emitting unit with high reliability can be provided.

A lighting device including a light-emitting unit with a small energy loss can be provided. A lighting device including a light-emitting unit with high reliability can be provided.

Further, an object is to provide a method for manufacturing a light-emitting unit with small energy loss. Furthermore, an object is to provide a method for manufacturing a light-emitting unit with high reliability.

BRIEF DESCRIPTION OF DRAWINGS

FIGS. 1A and 1B illustrate a light-emitting unit of one embodiment of the present invention.

FIGS. 3A and 3B illustrate a light-emitting unit of one embodiment of the present invention.

BEST MODE FOR CARRYING OUT THE INVENTION

Figure 2A:
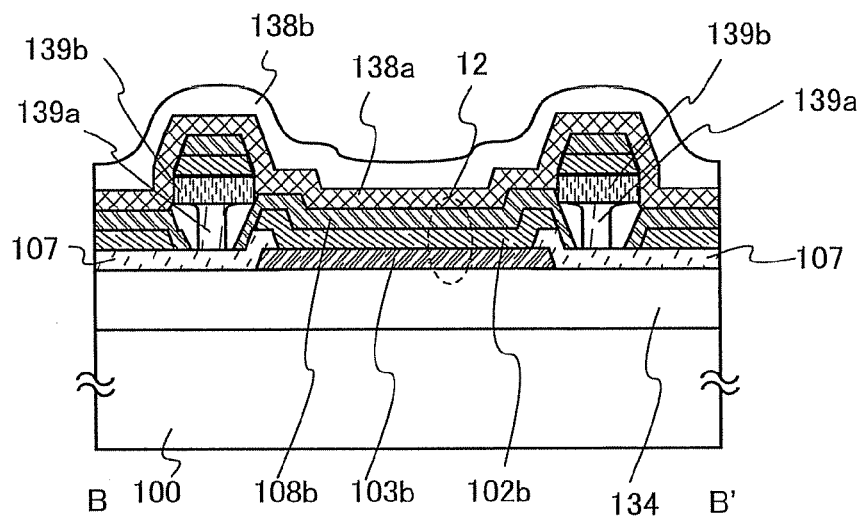
FIGS. 2A and 2B illustrate a light-emitting unit of one embodiment of the present invention.

Embodiments will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

Figure 2B:
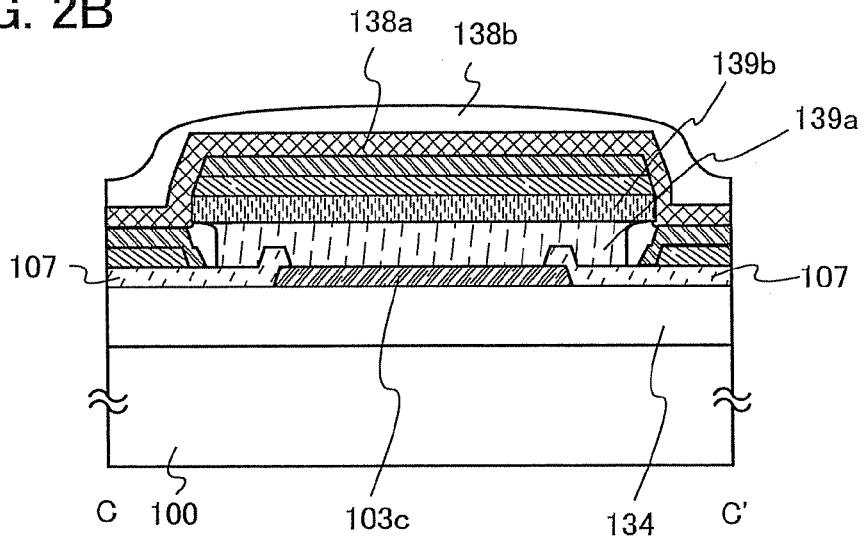
Figure 15A:
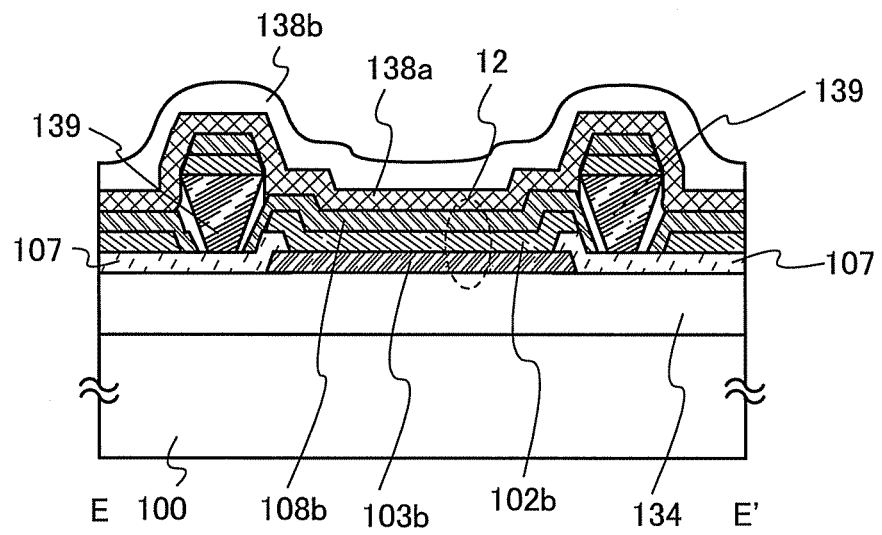
FIGS. 15A and 15B illustrate a light-emitting unit of one embodiment of the present invention.
Figure 15B:
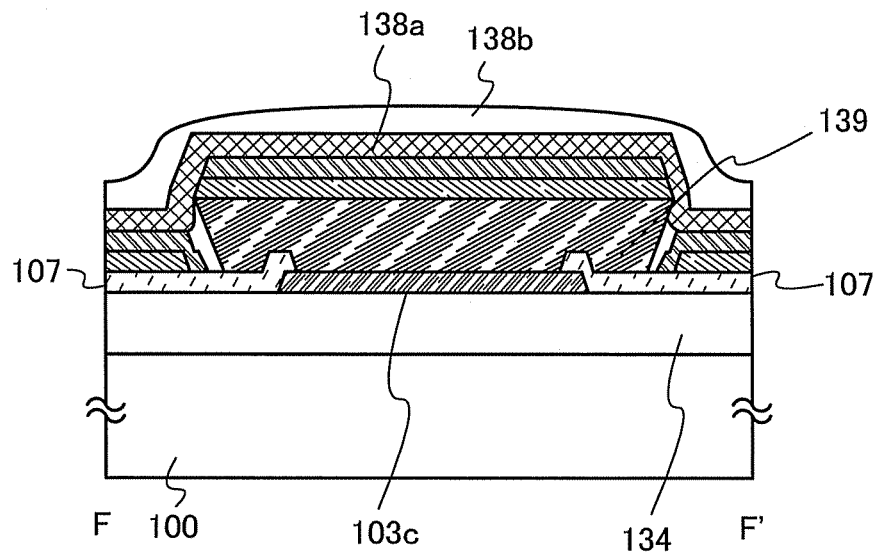

In this embodiment, a light-emitting unit of one embodiment of the present invention will be described with reference to FIGS. 1A and 1B, FIGS. 2A and 2B, FIGS. 3A and 3B, FIG. 4A, FIG. 7, FIGS. 15A and 15B, and FIGS. 16A and 16B. FIG. 1B is a cross-sectional view along a line A-A' in FIG. 1A. FIG. 2A is a cross-sectional view along a line B-B' in FIG. 1A. FIG. 2B is a cross-sectional view along a line C-C' in FIG. 1A. FIG. 3B is a cross-sectional view along a line D-D' in FIG. 3A. FIG. 15A is a cross-sectional view along a line E-E' in FIG. 3A. FIG. 15B is a cross-sectional view along a line F-F' in FIG. 3A.

Structural Example

First, a structure of the light-emitting unit described in this embodiment will be described.

Note that in this specification, a light-emitting element includes an island-shaped lower electrode, an island-shaped upper electrode, and an island-shaped layer containing a light-emitting organic compound interposed between the lower electrode and the upper electrode. An EL layer at least includes the layer containing a light-emitting organic compound. The EL layer can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like in addition to the layer containing a light-emitting organic compound are combined as appropriate. Note that in one embodiment of the present invention, a light-emitting element (a tandem light-emitting element) in which a plurality of EL layers are provided between a lower electrode and an upper electrode can be used. A stacked-layer structure of two layers, three layers, or four layers (in particular, a stacked-layer structure of three layers) is preferably used.

Structural Example 1

A light-emitting unit illustrated in FIGS. 1A and 1B and FIGS. 2A and 2B includes a wiring 133a, a wiring 133b, a planarization layer 134, a partition wall 107, a first light-emitting element 11, a second light-emitting element 12, a third light-emitting element 13, a separation layer 139 (a leg portion 139a and a stage portion 139b), a sealing film 138a, and a sealing film 138b, which are provided over a substrate 100.

The first light-emitting element 11 includes a first electrode 103a formed over the planarization layer 134, an EL layer 102a formed over the first electrode 103a, and a second electrode 108a formed over the EL layer 102a.

The second light-emitting element 12 includes a first electrode 103b formed over the planarization layer 134, an EL layer 102b formed over the first electrode 103b, and a second electrode 108b formed over the EL layer 102b.

The third light-emitting element 13 includes a first electrode 103c formed over the planarization layer 134, an EL layer 102c formed over the first electrode 103c, and a second electrode 108c formed over the EL layer 102c.

The first electrode 103a in the first light-emitting element 11 is connected to the wiring 133a. The second electrode 108c in the third light-emitting element 13 is connected to the wiring 133b through an extraction electrode 160.

In the Structural Example 1, the second electrode 108a is provided so as to extend beyond an edge portion of the first electrode 103a with a partition wall 107 interposed therebetween at the place where the insulating partition wall 107 is provided for the edge portion of the first electrode 103a. The second electrode 108a is directly connected to the first electrode 103b. Therefore, the first light-emitting element 11 and the second light-emitting element 12 are connected in series to each other.

Note that the partition wall 107 has an edge portion with a forward tapered shape. In the forward tapered shape, a layer gradually increases in thickness from its edge and is in contact with a layer serving as a base in a cross section. With the forward tapered edge portion, a film formed over the partition wall 107 can be prevented from being broken.

The separation layer 139 includes a leg portion and a stage portion protruding over the electrode so that a projected area of the stage portion is larger than that of the leg portion. In the Structural Example 1, the separation layer 139 includes the leg portion 139a and the stage portion 139b.

A region where the second electrode 108a is connected to the first electrode 103b is included in a region where the stage portion 139b of the separation layer 139 protrudes over the first electrode 103b. In this region, the second electrode 108a formed by promoting entrance is formed beyond an edge portion of the EL layer 102a to be in contact with the first electrode 103b. In the Structural Example 1, in this region, the EL layer 102a formed by suppressing entrance is not formed over the first electrode 103b, and only the second electrode 108a formed by promoting entrance is formed to be in contact with the first electrode 103b.

Thus, the first light-emitting element 11 and the second light-emitting element 12 are connected in series, so that the light-emitting unit with high driving voltage can be provided.

The same can be said for the second light-emitting element 12 and the third light-emitting element 13.

The partition wall 107 is provided to cover the edge portion of the first electrode 103a in the first light-emitting element 11 illustrated in FIG. 1B. Thus, a short circuit between the first electrode 103a and the second electrode 108a at a step portion formed at the edge portion of the first electrode 103a can be prevented, whereby the light-emitting unit with high reliability can be provided.

Moreover, when a partition wall whose one edge portion is covered with the EL layer 102b and the other edge portion is in contact with the separation layer 139 is provided over the first electrode 103b, a short circuit between the first electrode 103b and the second electrode 108b in a region where the first electrode 103b and the second electrode 108b overlap with the stage portion 139b can be prevented.

In addition, with a structure capable of being manufactured without using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a maintenance cost such as cleaning.

In the Structural Example 1, a void 141 (an empty space) is provided in a region overlapping with the stage portion 139b. It is more preferable to introduce a dry agent to the void 141.

By providing the sealing film 138a and the sealing film 138b which cover a top surface of the light-emitting elements, the light-emitting unit with high reliability can be provided.

Further, a base film may be formed over the substrate. The sealing films and the base film have a function of protecting the light-emitting elements from water or the like from the outside. By providing the sealing films and the base film, the deterioration of the light-emitting elements is reduced and the durability and lifetime of the lighting unit can be improved.

<Shape of First Electrode>

Here, by carefully designing a shape of one edge portion of a first electrode, physical and electrical contact between the first electrode and a second electrode can be favorable even when an EL layer is provided between the first electrode and the second electrode.

Figure 7:
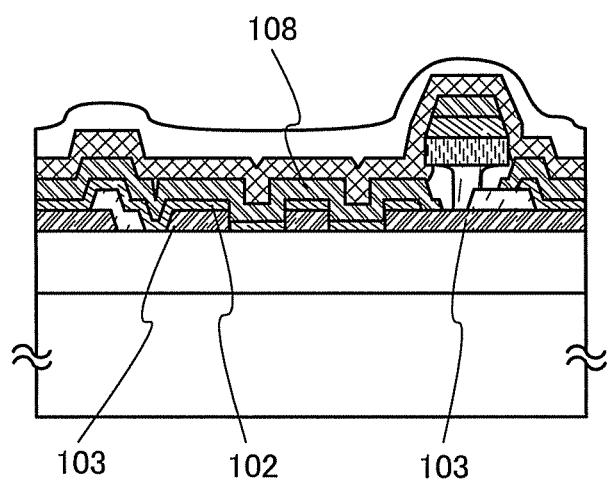
FIG. 7 illustrates a shape of a first electrode of one embodiment of the present invention.

An edge portion of a first electrode 103 illustrated in FIG. 7 is processed to have a plurality of steps. At such a step, an EL layer 102 with a relatively small thickness can be divided by being broken at the step. On the other hand, a second electrode 108 formed over the EL layer 102 is formed to have a thickness larger than that of the EL layer 102, whereby the second electrode 108 can cover the first electrode 103 without being divided at the step. Thus, the first electrode 103 and the second electrode 108 can be directly in contact with each other at a side surface of the step where the EL layer 102 is divided, so that the electrical contact can be favorable.

Note that depressed portions are provided in parts of the edge portion, of the first electrode in FIG. 7; however, the edge portion may have an appropriate shape, for example, the edge portion of the first electrode may have a comb-like shape so that the EL layer can be efficiently divided and the first electrode can be covered with the second electrode without the second electrode being divided.

Figure 16A:
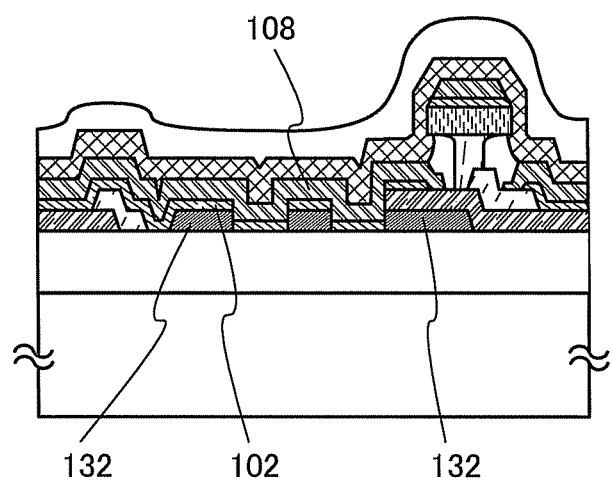
FIGS. 16A and 16B each illustrate a light-emitting unit of one embodiment of the present invention.
Figure 16B:
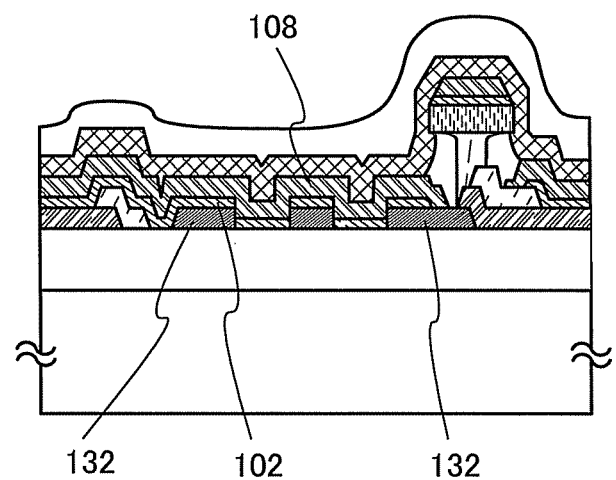

Further, the step may be provided in an auxiliary wiring 132 described as an example in Embodiment 2 as illustrated in FIGS. 16A and 16B. The thickness of the auxiliary wiring 132 is preferably larger than that of the first electrode 103, in which case a large step can be provided, so that the EL layer 102 can be efficiently divided and the second electrode 108 can be easily in contact with the first electrode at a side surface of the step.

In the Structural Example 1, the leg portion 139a and the stage portion 139b of the separation layer 139 are formed of different materials. As in a Structural Example 2 described below, the separation layer 139 can be formed of one material.

Structural Example 2

A light-emitting unit illustrated in FIGS. 3A and 3B and FIGS. 15A and 15B includes the wiring 133a, the wiring 133b, the planarization layer 134, the partition wall 107, the first light-emitting element 11, the second light-emitting element 12, the third light-emitting element 13, the separation layer 139, the sealing film 138a, and the sealing film 138b, which are provided over the substrate 100.

The Structural Example 2 has a structure similar to that of the Structural Example 1 except the separation layer 139. In the Structural Example 2, a stage portion (an upper portion at least including an upper base) of the separation layer 139 is protruded over the electrode so that a projected area of the stage portion is larger than that of a leg portion (a lower portion at least including a lower base) of the separation layer 139.

In FIG. 3B, the partition wall 107 covers an edge portion of the first electrode 103a. With such a structure, the separation layer 139 can be formed to be close to an edge portion of the first electrode 103b as much as possible, whereby the area of an opening of the light-emitting unit can be increased, which is preferable. However, the present invention is not limited to this structure.

Figure 4A:
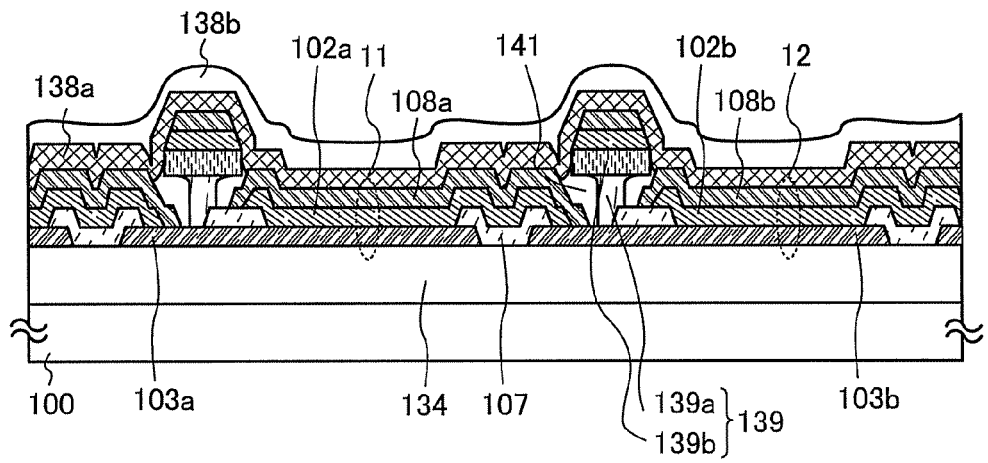
FIGS. 4A to 4C each illustrate a light-emitting unit of one embodiment of the present invention.

For example, as illustrated in FIG. 4A, the partition wall 107 can cover the edge portion of the first electrode 103a and the edge portion of the first electrode 103b.

Structural Example 3

Specifically, a light-emitting unit illustrated in FIG. 4A includes the planarization layer 134, the partition wall 107, the first light-emitting element 11, the second light-emitting element 12, the separation layer 139 (the leg portion 139a and the stage portion 139b), the sealing film 138a, and the sealing film 138b, which are provided over the substrate 100.

Each light-emitting element includes a first electrode formed over the planarization layer 134, an EL layer formed over the first electrode, and a second electrode formed over the EL layer.

In the Structural Example 3, the second electrode 108a is provided so as to extend beyond an edge portion of the first electrode 103a with the partition wall 107 interposed therebetween at the place where the insulating partition wall 107 is provided for the edge portion of the first electrode 103a. In addition, the second electrode 108a is provided so as to extend beyond an edge portion of the first electrode 103b with the partition wall 107 interposed therebetween at the place where the insulating partition wall 107 is provided for the edge portion of the first electrode 103b. The second electrode 108a is directly connected to the first electrode 103b. Therefore, the first light-emitting element 11 and the second light-emitting element 12 are connected in series to each other.

A region where the second electrode 108a is connected to the first electrode 103b is included in a region where the stage portion 139b of the separation layer 139 protrudes over the first electrode 103b. In this region, the second electrode 108a formed by promoting entrance is formed beyond an edge portion of the EL layer 102a to be in contact with the first electrode 103b. In the Structural Example 3, in this region, the EL layer 102a formed by suppressing entrance is not formed over the first electrode 103b, and only the second electrode 108a formed by promoting entrance is formed to be in contact with the first electrode 103b.

Consequently, the light-emitting unit with high driving voltage, in which the first light-emitting element 11 and the second light-emitting element 12 are connected in series, can be provided.

The partition wall 107 is provided to cover the edge portion of the first electrode 103a in the first light-emitting element 11 illustrated in FIG. 4A. Thus, a short circuit between the first electrode 103a and the second electrode 108a can be prevented at a step portion formed in the edge portion of the first electrode 103a, whereby the light-emitting unit with high reliability can be provided.

Further, the partition wall 107 is provided to cover the edge portion of the first electrode 103b. Therefore, even in the case where the second electrode 108a is thin, the light-emitting unit with high reliability, in which the second electrode 108a is difficult to break at a step portion formed at the edge portion of the first electrode 103b can be provided.

Moreover, by providing the partition wall 107 whose one edge portion is covered with the EL layer 102b and the other edge portion is in contact with the separation layer 139, over the first electrode 103b, a short circuit between the first electrode 103b and the second electrode 108b in a region where the first electrode 103b and the second electrode 108b overlap with the stage portion 139b can be prevented.

In addition, with a structure capable of being manufactured without using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a cleaning cost.

<<Material>>

Examples of materials that can be used for each layer will be described below.

[Substrate]

The substrate 100 is a substrate on the side where light is extracted. For the material of the substrate 100, a material with a light-transmitting property, such as glass, quartz, or an organic resin can be used.

When an organic resin is used for the substrate 100, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

[Sealing Film·Base Film]

Each of the sealing film and the base film can be formed using a material with a barrier property. In addition, either of the sealing film or the base film, which is provided on the side where light is extracted, is formed using a light-transmitting property.

As each of the sealing film and the base film, an inorganic insulating film can be formed by a sputtering method, for example. For example, a silicon nitride film, an aluminum oxide film, a silicon oxide film, or the like may be formed.

The sealing film is preferably a film having transmittance less than or equal to $10^{-6}$ g/m$^2$·day and a gas barrier property, for example. A stacked-layer structure in which at least one layer containing an inorganic material is interposed between layers containing an organic material can be used for the sealing film, for example. As the layer containing an organic material, an adhesive layer such as an epoxy-based adhesive layer can be given as an example. As the layer containing an inorganic material, a film with a barrier property, such as a silicon oxide film or a silicon nitride film can be given as an example.

Specifically, a thermosetting resin (e.g., an epoxy-based adhesive) is applied to a film to be a supporting body to a thickness of several tens of micrometers and dried, and an inorganic film (e.g., a silicon oxide film) is formed to a thickness of several micrometers thereover to form a first member; thermosetting epoxy resin is applied to a mold release film and dried to form a second member; and the first member and the second member are bonded to each other, so that a stack is formed. Next, a surface of the stack from which the mold release film is removed is bonded to a top surface of the above-described light-emitting element so as to face each other, thermocompression is performed, and then the epoxy resin may be cured by heat. With such a structure, the deterioration of the light-emitting element is suppressed and the durability and lifetime of the light-emitting unit can be improved.

When an organic resin is used for a substrate, a glass layer with a thickness greater than or equal to 25 μm and less than or equal to 100 μm may be used. The thickness of the glass layer is typically greater than or equal to 45 μm and less than or equal to 80 μm. By combining an organic resin substrate and a glass layer, moisture, an impurity, or the like can be prevented from entering an organic compound or a metal material included in the light-emitting element from the outside of the light-emitting unit, and the weight of the light-emitting unit can be reduced.

[Separation Layer]

A separation layer can be formed using an inorganic insulating material or an organic insulating material. For example, a negative type photosensitive resin material can be used.

[Light-Emitting Element]

As a light-transmitting material for the first electrode, indium oxide, indium tin oxide (ITO), indium zinc oxide, zinc oxide, zinc oxide to which gallium is added, graphene, or the like can be used.

In addition, for the first electrode, a metal material such as gold, platinum, nickel, tungsten, chromium, molybdenum, iron, cobalt, copper, palladium, or titanium can be used. Further, a nitride of the metal material (e.g., titanium nitride) or the like may be used. In the case of using the metal material (or the nitride thereof), the first electrode may be thinned so as to be able to transmit light.

The thickness of the first electrode is for example, greater than or equal to 50 nm and less than or equal to 300 nm, preferably greater than or equal to 80 nm and less than or equal to 130 nm, more preferably greater than or equal to 100 nm and less than or equal to 110 nm.

Examples of structures of the EL layer will be described in detail in Embodiment 8.

The second electrode is provided on the side opposite to the side where light is extracted and is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

[Wiring]

For the wiring, a single layer or a stacked layer using a material selected from copper (Cu), titanium (Ti), tantalum (Ta), tungsten (W), molybdenum (Mo), chromium (Cr), neodymium (Nd), scandium (Sc), and nickel (Ni) or an alloy material including any of these materials as its main component can be used. Aluminum can also be used for the material of the wiring; however, in that case, the wiring might be corroded when the wiring is provided to be in direct contact with ITO or the like. Therefore, it is preferable that the wiring include a stacked-layer structure and aluminum be used in a layer which is not in contact with ITO or the like. The wiring of this embodiment includes a stacked layer in which a copper film is formed over a titanium film. Copper can be preferably used because of its low resistance. The thickness of the wiring is preferably greater than or equal to 2 μm and less than or equal to 35 μm.

[Planarization Layer]

The planarization layer 134 can be formed using an inorganic insulating material or an organic insulating material. Note that the planarization layer 134 formed using a heat-resistant organic insulating material such as an acrylic resin, a polyimide, a benzocyclobutene-based resin, a polyamide, or an epoxy resin is preferably used as a planarization insulating film. Other than such organic insulating materials, it is possible to use a low-dielectric constant material (a low-k material), a siloxane based resin, phosphosilicate glass (PSG), borophosphosilicate glass (BPSG), or the like. Note that the planarization layer 134 may be formed by stacking a plurality of insulating films formed using any of these materials.

A method for forming the planarization layer 134 is not particularly limited, and a sputtering method, a spin coat method, a dipping method, a printing method, an inkjet method, or the like can be used depending on its material.

[Partition Wall]

For a material of the partition wall, an organic resin such as polyimide, acrylic, polyamide, or epoxy or an inorganic insulating material can be used, for example.

The angle of a side wall surface of a layer whose edge portion with a forward tapered shape is in contact with a layer to be a base is greater than or equal to 10° and less than or equal to 85°, preferably greater than or equal to 60° and less than or equal to 80°.

It is particularly preferable that the partition wall be formed using a photosensitive resin material to have an opening over the first electrode so that a sidewall of the opening is formed as an inclined surface with continuous curvature. Specifically, the radius of curvature of a curve drawn by a cross section of an insulating film is desirably approximately 0.2 μm to 2 μm.

A method for forming the partition wall is not particularly limited, and a photolithography method, a sputtering method, an evaporation method, a droplet discharging method (e.g., an inkjet method), a printing method (e.g., a screen printing method or an off-set printing method), or the like may be used.

The thickness of the partition wall may be for example, greater than or equal to 20 nm and less than or equal to 20 μm, preferably greater than or equal to 20 nm and less than or equal to 200 nm, more preferably greater than or equal to 50 nm and less than or equal to 100 nm.

This embodiment can be freely combined with other embodiments.

Embodiment 2

In this embodiment, a light-emitting unit of one embodiment of the present invention will be described with reference to FIGS. 4B and 4C, FIG. 17, FIGS. 18A and 18B, FIGS. 19A and 19B, and FIG. 20.

In the light-emitting unit described in this embodiment, an auxiliary wiring is provided to be in contact with a first electrode. When an auxiliary wiring is included, voltage drop due to the resistance of a first electrode can be prevented.

Structural Example

First, a structure of the light-emitting unit described in this embodiment will be described.

Structural Example 4

Figure 4B:
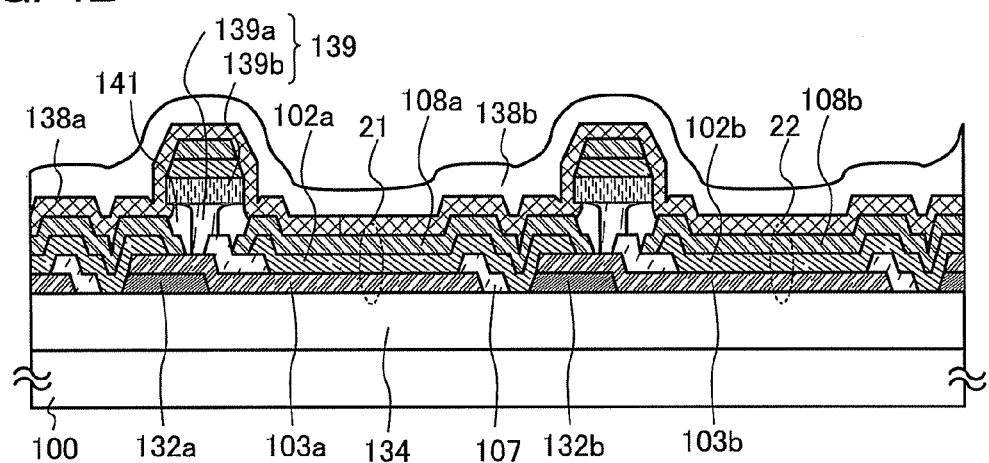

A light-emitting unit illustrated in FIG. 4B includes the planarization layer 134, an auxiliary wiring 132a, an auxiliary wiring 132b, a first light-emitting element 21, a second light-emitting element 22, the partition wall 107, the separation layer 139 (the leg portion 139a and the stage portion 139b), the sealing film 138a, and the sealing film 138b, which are provided over the substrate 100.

Each light-emitting element includes a first electrode formed over the planarization layer 134, an EL layer formed over the first electrode, and a second electrode formed over the EL layer.

In the Structural Example 4, the second electrode 108a is provided so as to extend beyond an edge portion of the first electrode 103a at the place where the insulating partition wall 107 is provided for the edge portion of the first electrode 103a. The second electrode 108a is directly connected to the first electrode 103b.

A region where the second electrode 108a is connected to the first electrode 103b is included in a region where the stage portion 139b of the separation layer 139 protrudes over the first electrode 103b. In this region, the second electrode 108a formed by promoting entrance is formed beyond an edge portion of the EL layer 102a to be in contact with the first electrode 103b. In the Structural Example 4, in this region, the EL layer 102a formed by suppressing entrance is not formed over the first electrode 103b, and only the second electrode 108a formed by promoting entrance is formed to be in contact with the first electrode 103b.

Consequently, the light-emitting unit with high driving voltage, in which the first light-emitting element 21 and the second light-emitting element 22 are connected in series, can be provided.

The partition wall 107 is provided to cover the edge portion of the first electrode 103a in the first light-emitting element 21 illustrated in FIG. 4B. Thus, a short circuit between the first electrode 103a and the second electrode 108a at a step portion formed at the edge portion of the first electrode 103a can be prevented, whereby the light-emitting unit with high reliability can be provided.

Moreover, when a partition wall whose one edge portion is covered with the EL layer 102b and the other edge portion is in contact with the separation layer 139 is provided over the first electrode 103b, a short circuit between the first electrode 103b and the second electrode 108b in a region where the first electrode 103b and the second electrode 108b overlap with the stage portion 139b can be prevented.

In addition, with a structure capable of being manufactured without, using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a cleaning cost.

In the Structural Example 4, when a conductive oxide is used as a light-transmitting material for the first electrode, an insulating oxide film is formed at the interface between the first electrode and the second electrode in some cases, depending on a combination of the conductive oxide and a metal used for the second electrode. When an insulating oxide film is formed, electrical resistance increases, and power consumption of the light-emitting unit increases.

However, in a Structural Example 5 described below, a first electrode and a second electrode are electrically connected to each other through an auxiliary wiring; thus, by appropriately selecting a material of the auxiliary wiring, formation of an insulating oxide film and an increase in electrical resistance can be prevented.

Structural Example 5

Figure 4C:
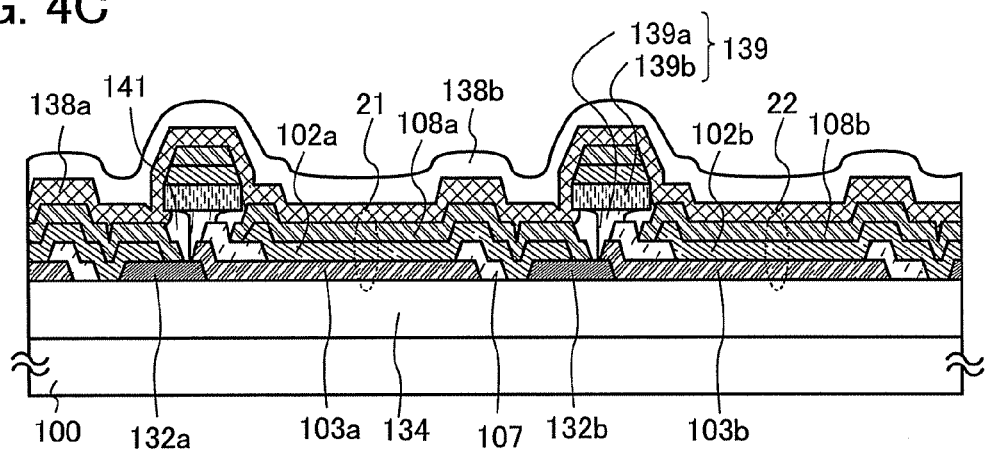

A light-emitting unit illustrated in FIG. 4C includes the planarization layer 134, the auxiliary wiring 132a, the auxiliary wiring 132b, the first light-emitting element 21, the second light-emitting element 22, the partition wall 107, the separation layer 139 (the leg portion 139a and the stage portion 139b), the sealing film 138a, and the sealing film 138b, which are provided over the substrate 100.

Each light-emitting element includes a first electrode faulted over the planarization layer 134, an EL layer formed over the first electrode, and a second electrode formed over the EL layer.

In the Structural Example 5, the second electrode 108a is provided so as to extend beyond an edge portion of the first electrode 103a at the place where the insulating partition wall 107 is provided for the edge portion of the first electrode 103a. The second electrode 108a is directly connected to the auxiliary wiring 132b. The auxiliary wiring 132b is directly connected to the first electrode 103b. Therefore, the second electrode 108a is directly connected to the first electrode 103b. Accordingly, the first light-emitting element 21 and the second light-emitting element 22 are connected in series to each other.

A region where the second electrode 108a is connected to the auxiliary wiring 132b is included in a region where the stage portion 139b of the separation layer 139 protrudes over the auxiliary wiring 132b. In this region, the second electrode 108a formed by promoting entrance is formed beyond an edge portion of the EL layer 102a to be in contact with the auxiliary wiring 132b. In the Structural Example 5, in this region, the EL layer 102a formed by suppressing entrance is not formed over the auxiliary wiring 132b, and only the second electrode 108a formed by promoting entrance is formed to be in contact with the auxiliary wiring 132b.

Consequently, the light-emitting unit with high driving voltage, in which the first light-emitting element 21 and the second light-emitting element 22 are connected in series, can be provided.

The partition wall 107 is provided to cover the edge portion of the first electrode 103a in the first light-emitting element 21 illustrated in FIG. 4C. Thus, a short circuit between the first electrode 103a and the second electrode 108a can be prevented at a step portion formed at the edge portion of the first electrode 103a, whereby the light-emitting unit with high reliability can be provided.

Moreover, when a partition wall whose one edge portion is covered with the EL layer 102b and the other edge portion is in contact with the separation layer 139 is provided over the first electrode 103b, a short circuit between the first electrode 103b and the second electrode 108b in a region where the first electrode 103b and the second electrode 108b overlap with the stage portion 139b can be prevented.

In addition, with a structure capable of being manufactured without using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a cleaning cost.

Application Example

Figure 17:
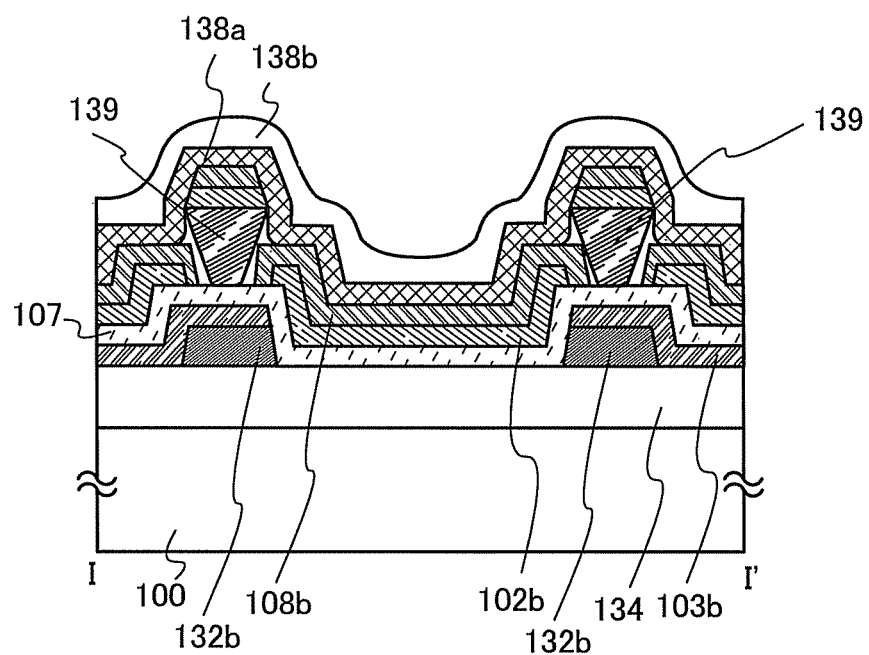
FIG. 17 illustrates a light-emitting unit of one embodiment of the present invention.
Figure 18A:
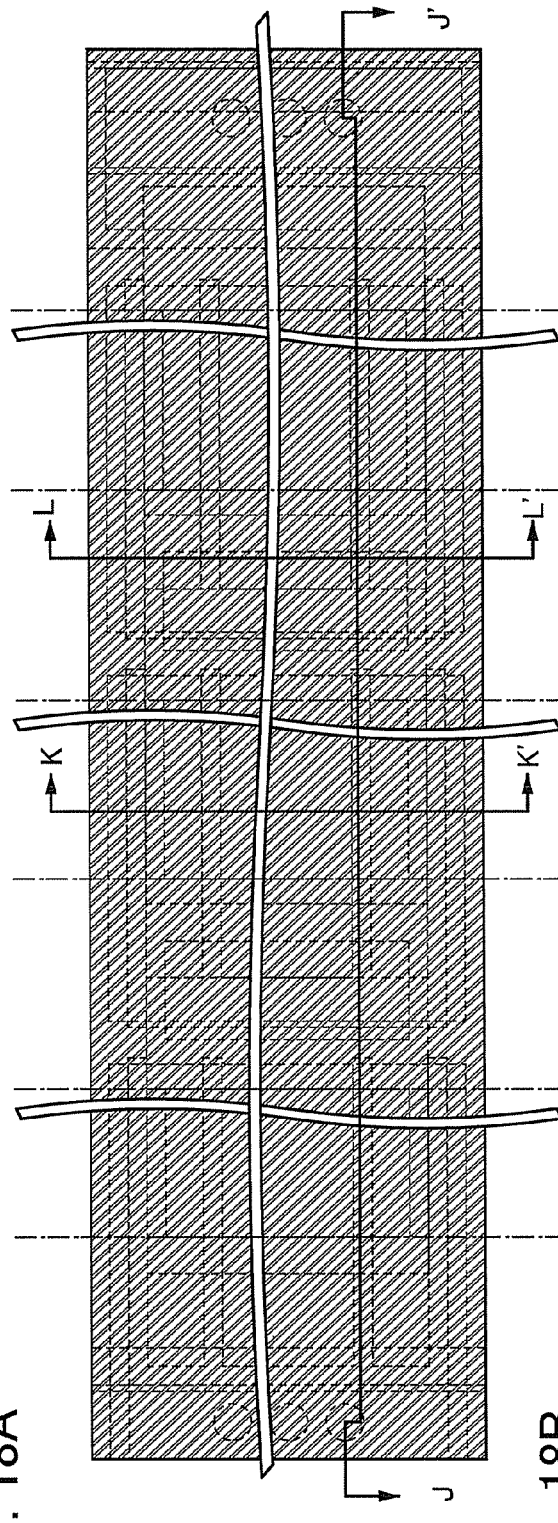
FIGS. 18A and 18B illustrate a light-emitting unit of one embodiment of the present invention.
Figure 18B:
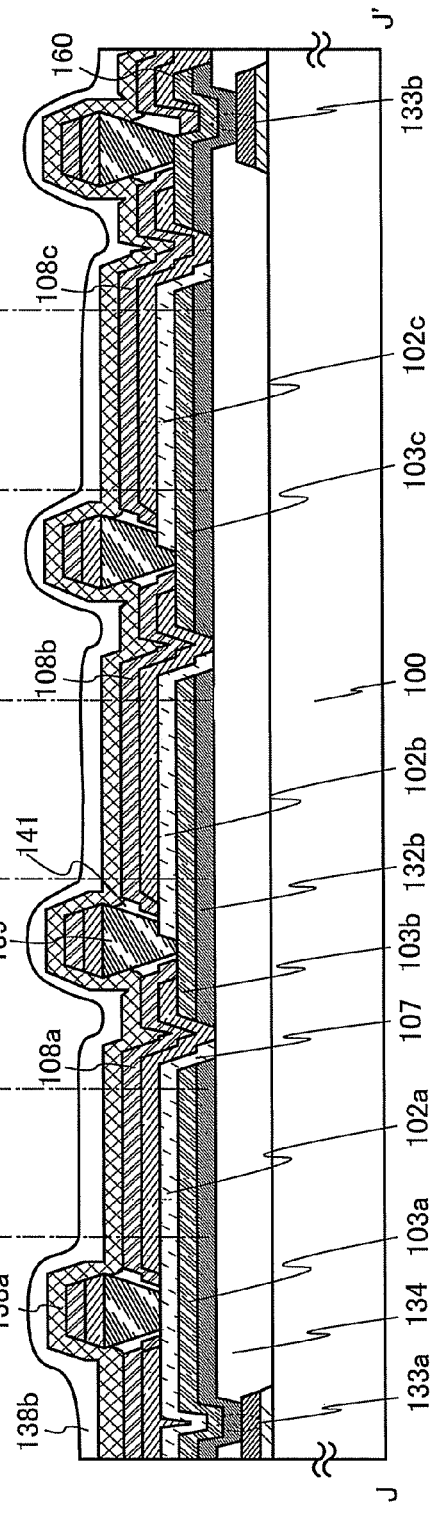
Figure 19A:
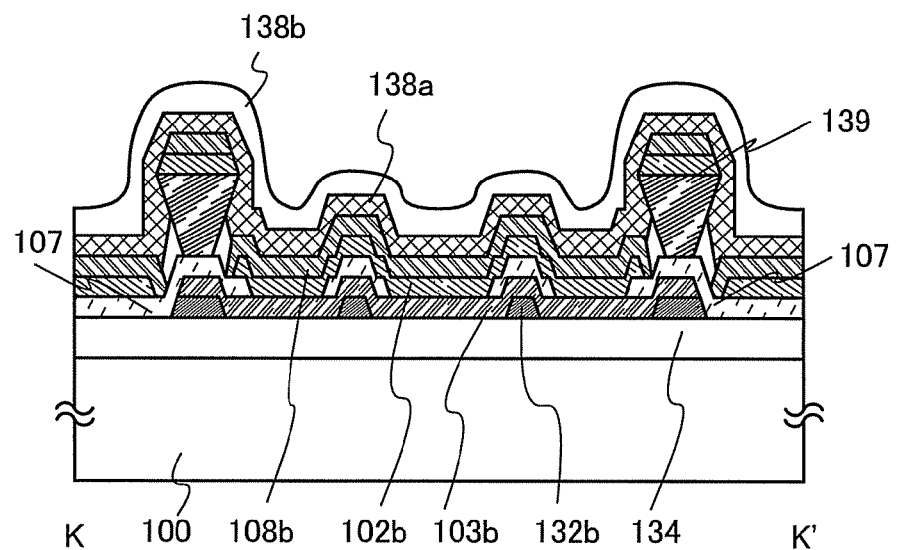
FIGS. 19A and 19B illustrate a light-emitting unit of one embodiment of the present invention.
Figure 19B:
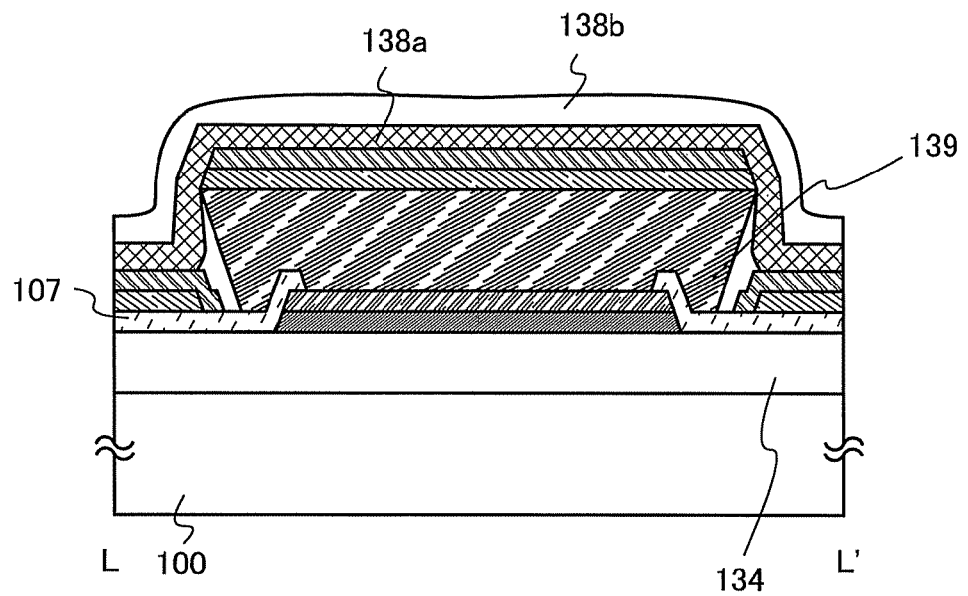

One embodiment of a light-emitting unit including an auxiliary wiring will be described with reference to FIG. 17, FIGS. 18A and 18B, FIGS. 19A and 19B, and FIG. 20. FIG. 18B is a cross-sectional view along a line J-J' in FIG. 18A. FIG. 19A is a cross-sectional view along a line K-K' in FIG. 18A. FIG. 19B is a cross-sectional view along a line L-L' in FIG. 18A.

The light-emitting unit described as an application example includes the auxiliary wiring in a light-emitting region. The auxiliary wiring extends horizontally (in the J-J' direction), whereby voltage drop due to film resistance of a first electrode can be prevented.

As illustrated in FIG. 19A, the partition wall 107 is provided over the first electrode 103b to overlap with the auxiliary wiring 132b, so that the EL layer 102 can be prevented from being cut.

Figure 20:
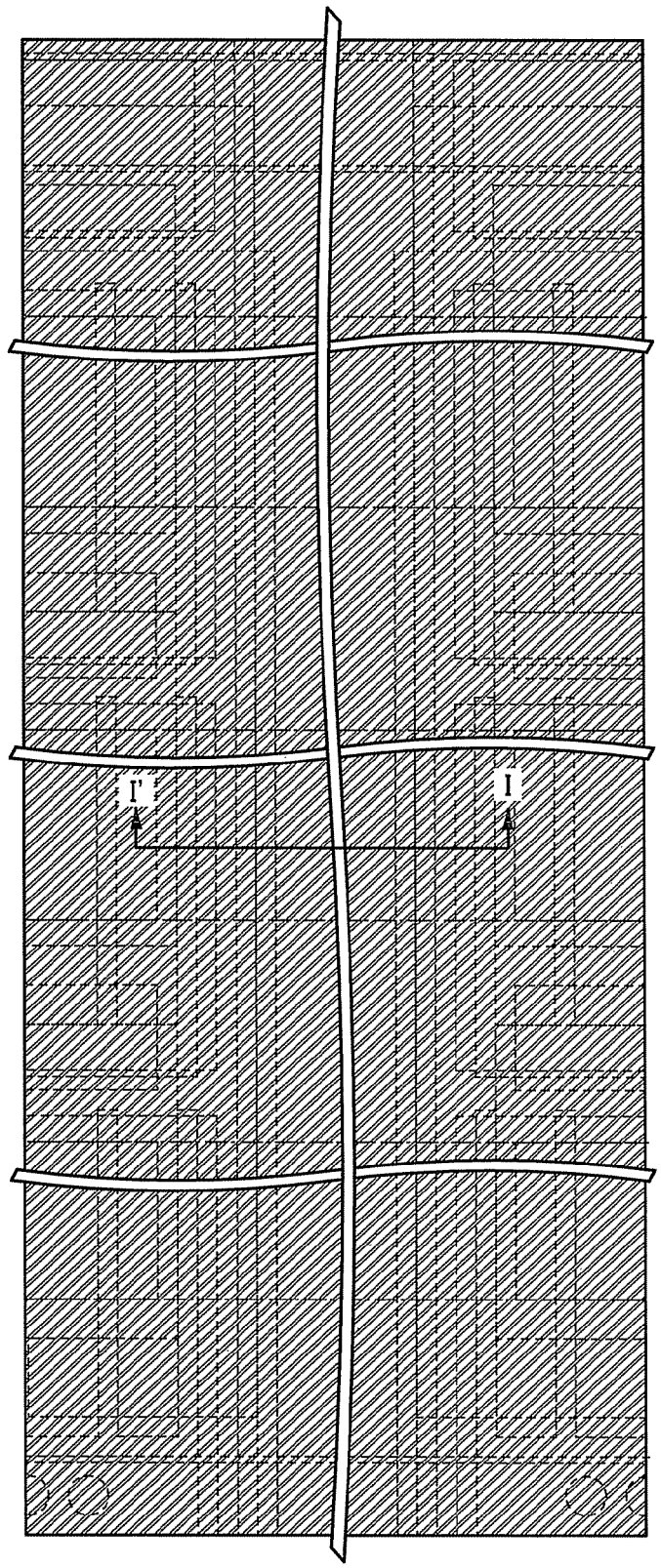
FIG. 20 illustrates a light-emitting unit of one embodiment of the present invention.

FIG. 20 illustrates a top view of two light-emitting units adjacent to each other. FIG. 17 is a cross-sectional view along a line I-I' in FIG. 20. As illustrated in FIG. 17, the two light-emitting units adjacent to each other are electrically separated from each other by the separation layer 139.

<<Material>>

An example of a material that can be used for each layer will be described below.

The same structures as those in Embodiment 1 can be used for structures of the substrate, the planarization layer, the light-emitting element, the partition wall, the separation layer, and the sealing film.

Note that since the auxiliary wiring is provided in the structure described in this embodiment, an increase in resistance can be prevented even when the thickness of the first electrode is reduced to greater than or equal to 70 nm and less than or equal to 100 nm.

In addition, the first electrode and the second electrode are electrically connected to each other through the auxiliary wiring in the structure described in this embodiment. Therefore, even when the first electrode is in contact with the second electrode, an insulating oxide film is not formed at the interface, so that a single layer of aluminum may be used for the second electrode.

[Auxiliary Wiring]

For a material of the auxiliary wiring, a single layer or a stacked layer using a material selected from copper (Cu), titanium (Ti), tantalum (Ta), tungsten (W), molybdenum (Mo), chromium (Cr), neodymium (Nd), scandium (Sc), or nickel (Ni) or an alloy material including any of these materials as its main component is used. Aluminum can also be used for the material of the auxiliary wiring; however, in that case, it is preferable that the auxiliary wiring have a stacked-layer structure so that the above-described corrosion might not occur, and aluminum be used for a layer which is not in contact with ITO or the like. The thickness of the auxiliary wiring can be greater than or equal to 0.1 μm and less than or equal to 3 preferably greater than or equal to 0.1 μm and less than or equal to 0.5 μm.

This embodiment can be freely combined with other embodiments.

Embodiment 3

In this embodiment, light-emitting units each of which is one embodiment of the present invention will be described with reference to FIGS. 5A to 5D and FIG. 14.

In the light-emitting unit described in this embodiment, a side wiring is provided to be in contact with a first electrode. By providing the side wiring, voltage drop can be prevented. Consequently, the non-uniformity of the potential in the first electrode can be reduced, and a light-emitting element can uniformly emit light. In addition, in light-emitting unit described in this embodiment, the side wiring is provided to overlap with an EL layer and a second electrode. The side wiring includes a metal with conductivity higher than that of the first electrode. The side wiring has a property of transmitting light emitted from a light-emitting organic compound.

Structural Example

First, a structure of the light-emitting unit described in this embodiment will be described.

Structural Example 6

Figure 5A:
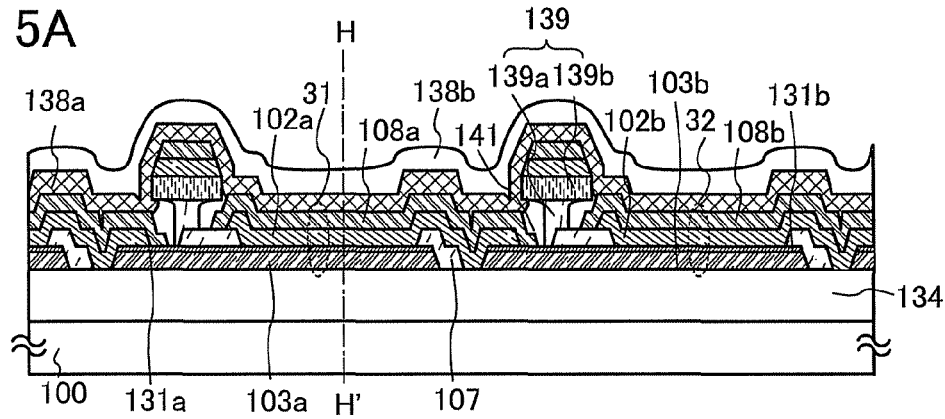
FIGS. 5A to 5D each illustrate a light-emitting unit of one embodiment of the present invention.

A light-emitting unit illustrated in FIG. 5A includes the planarization layer 134, a first light-emitting element 31, a second light-emitting element 32, the partition wall 107, the separation layer 139 (the leg portion 139a and the stage portion 139b), the sealing film 138a, and the sealing film 138b, which are provided over the substrate 100.

Each light-emitting element includes a first electrode formed over the planarization layer 134, a side wiring formed over the first electrode, an EL layer formed over the side wiring, and a second electrode formed over the EL layer.

In the Structural Example 6, the second electrode 108a is provided so as to extend beyond an edge portion of the first electrode 103a and an edge portion of the side wiring 131a at the place where the insulating partition wall 107 is provided for the edge portion of the first electrode 103a and the edge portion of the side wiring 131a. The second electrode 108a is directly connected to the side wiring 131b. The side wiring 131b is directly connected to the first electrode 103b. Therefore, the second electrode 108a is directly connected to the first electrode 103b. Accordingly, the first light-emitting element 31 and the second light-emitting element 32 are connected in series to each other.

A region where the second electrode 108a is connected to the side wiring 131b is included in a region where the stage portion 139b of the separation layer 139 protrudes over the side wiring 131b. In this region, the second electrode 108a formed by promoting entrance is formed beyond an edge portion, of the EL layer 102a to be in contact with the side wiring 131b. In the Structural Example 6, in this region, the EL layer 102a formed by suppressing entrance is not formed over the side wiring 131b, and only the second electrode 108a formed by promoting entrance is formed to be in contact with the side wiring 131b.

Consequently, the light-emitting unit with high driving voltage, in which the first light-emitting element 31 and the second light-emitting element 32 are connected in series, can be provided.

The partition wall 107 is provided to cover the edge portion of the first electrode 103a and an edge portion of the side wiring 131a in the first light-emitting element 31 illustrated in FIG. 5A. Thus, a short circuit between the first electrode 103a and the side wiring 131a, and the second electrode 108a can be prevented at a step portion formed in the edge portion of the first electrode 103a and the edge portion of the side wiring 131a, whereby the light-emitting unit with high reliability can be provided.

Moreover, by providing the partition wall 107 whose one edge portion is covered with the EL layer 102b and the other edge portion is in contact with the separation layer 139, over the side wiring 131b, a short circuit between the side wiring 131b and the second electrode 108b in a region where the side wiring 131b and the second electrode 108b overlap with the stage portion 139b can be prevented.

In addition, with a structure capable of being manufactured without using a metal mask, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a cleaning cost.

However, in a Structural Example 6, the first electrode and the second electrode are electrically connected to each other through the side wiring; thus, by appropriately selecting a material of the side wiring, formation of an insulating oxide film and an increase in electrical resistance can be prevented.

Figure 14:
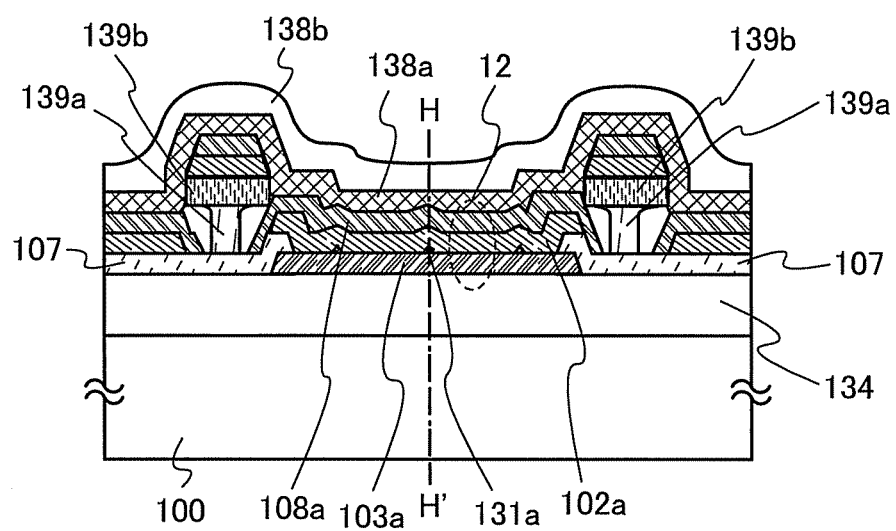
FIG. 14 illustrates a light-emitting unit of one embodiment of the present invention.

FIG. 14 illustrates a cross section which is perpendicular to a plane including a dashed-dotted line H-H' in FIG. 5A. In the cross section illustrated in FIG. 14, the side wiring 131a is provided between the first electrode 103a and the EL layer 102a.

The partition wall 107 covers the edge portion of the first electrode 103a in the first light-emitting element 31 in the Structural Example 6. With such a structure, the separation layer 139 can be formed to be close to an edge portion of the first electrode 103b as much as possible, whereby the area of an opening of the light-emitting unit can be increased, which is preferable. However, the present invention is not limited to this structure.

Figure 5B:
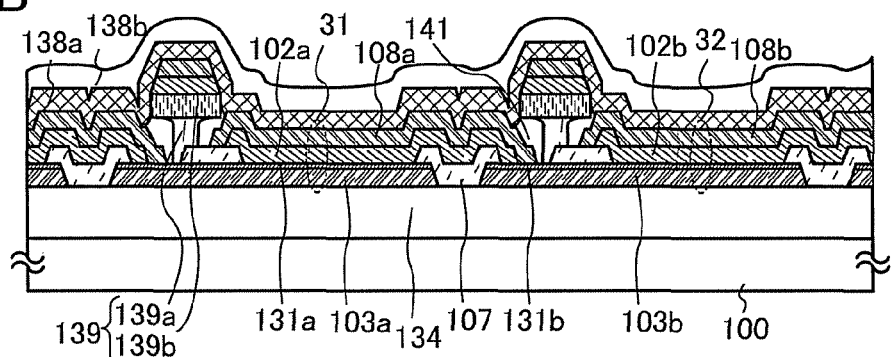

For example, as illustrated in FIG. 5B, the partition wall 107 can cover an edge portion of the first electrode 103a, an edge portion of the side wiring 131a, an edge portion of the first electrode 103b, and an edge portion of the side wiring 131b.

Structural Example 7

A light-emitting unit illustrated in FIG. 5B includes the planarization layer 134, the first light-emitting element 31, the second light-emitting element 32, the partition wall 107, the separation layer 139 (the leg portion 139a and the stage portion 139b), the sealing film 138a, and the sealing film 138b, which are provided over the substrate 100.

Each light-emitting element includes a first electrode formed over the planarization layer 134, a side wiring formed over the first electrode, an EL layer formed over the side wiring, and a second electrode formed over the EL layer.

In the Structural Example 7, the first light-emitting element 31 and the second light-emitting element 32 are connected in series to each other as in the Structural Example 6.

The partition wall 107 is provided to cover the edge portion of the first electrode 103a and the edge portion of the side wiring 131a in the first light-emitting element 31 illustrated in FIG. 5B. Thus, a short circuit between the first electrode 103a and the side wiring 131a, and the second electrode 108a can be prevented at a step portion formed in the edge portion of the first electrode 103a and the edge portion of the side wiring 131a, whereby the light-emitting unit with high reliability can be provided.

Further, the partition wall 107 is provided to cover the edge portion of the first electrode 103b and the edge portion of the side wiring 131b. Therefore, even in the case where the second electrode 108a is thin, the light-emitting unit with high reliability, in which the second electrode 108a is difficult to break at a step portion formed at the edge portion of the first electrode 103b and the edge portion of the side wiring 131b can be provided.

Moreover, by providing the partition wall 107 whose one edge portion is covered with the EL layer 102b and the other edge portion is in contact with the separation layer 139, over the first electrode 103b, a short circuit between the first electrode 103b and the side wiring 131b, and the second electrode 108b can be, prevented at a region where the first electrode 103b, the side wiring 131b, and the second electrode 108b overlap with the stage portion 139b.

The side wiring can be provided in combination with the auxiliary wiring described in the above embodiment and provided. An example will be described below.

Structural Example 8

Figure 5C:
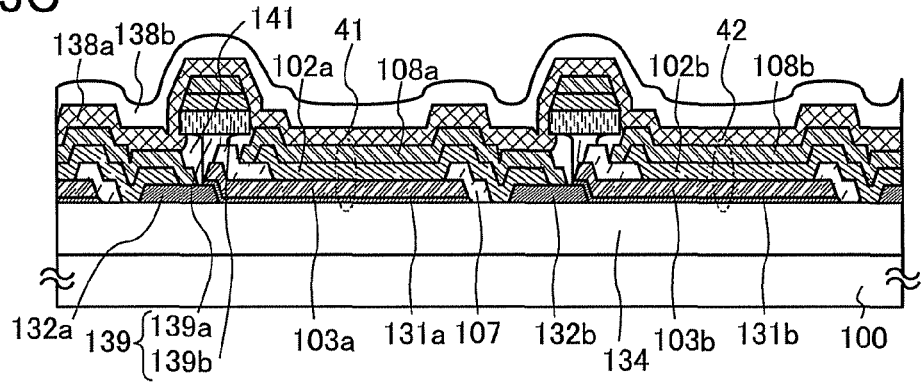

A light-emitting unit illustrated in FIG. 5C includes the planarization layer 134, the auxiliary wiring 132a, the auxiliary wiring 132b, the separation layer 139 (the leg portion 139a and the stage portion 139b), the sealing film 138a, the sealing film 138b, a first light-emitting element 41, and a second light-emitting element 42, which are provided over the substrate 100.

Each light-emitting element includes a side wiring formed over the planarization layer 134, a first electrode formed over the side wiring, an EL layer formed over the first electrode, and a second electrode formed over the EL layer.

In the Structural Example 8, the second electrode 108a is provided so as to extend beyond an edge portion of the first electrode 103a and an edge portion of the side wiring 131a at the place where the insulating partition wall 107 is provided for the edge portion of the first electrode 103a and the edge portion of the side wiring 131a. The second electrode 108a is directly connected to the auxiliary wiring 132b. The auxiliary wiring 132b is directly connected to the side wiring 131b. The side wiring 131b is directly connected to the first electrode 103b. Therefore, the second electrode 108a is directly connected to the first electrode 103b. Accordingly, the first light-emitting element 41 and the second light-emitting element 42 are connected in series to each other.

Consequently, the light-emitting unit with high driving voltage, in which the first light-emitting element 41 and the second light-emitting element 42 are connected in series, can be provided.

In FIG. 5C, the first electrode and the second electrode are electrically connected to each other through the auxiliary wiring and the side wiring. Therefore, by appropriately selecting materials of the auxiliary wiring and the side wiring, formation of an insulating oxide film and an increase in electrical resistance can be prevented.

The partition wall 107 is provided to cover the edge portion of the first electrode 103a and the edge portion of the side wiring 131a. Thus, a short circuit between the first electrode 103a and the second electrode 108a at a step portion formed at the edge portion of the first electrode 103a can be prevented, whereby the light-emitting unit with high reliability can be provided.

Figure 5D:
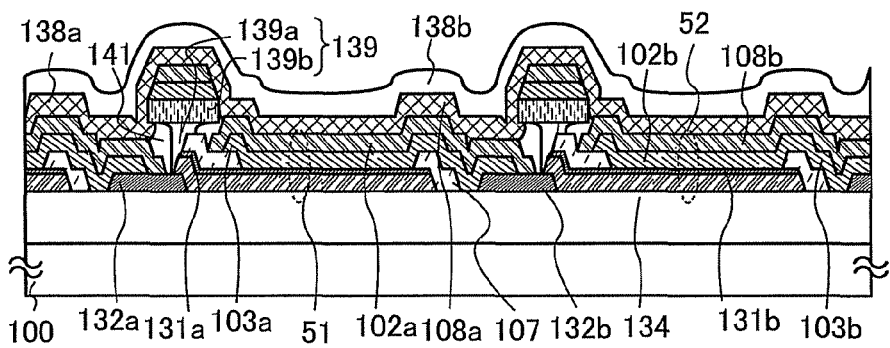

In FIG. 5C, the first electrode is provided over the side wiring; however, the side wiring may be provided over the first electrode as illustrated in FIG. 5D.

A light-emitting unit illustrated in FIG. 5D includes the planarization layer 134, the auxiliary wiring 132a, the auxiliary wiring 132b, the separation layer 139 (the leg portion 139a and the stage portion 139b), the sealing film 138a, the sealing film 138b, a first light-emitting element 51, and a second light-emitting element 52, which are provided over the substrate 100.

Each light-emitting element includes a first electrode formed over the planarization layer 134, a side wiring formed over the first electrode, an EL layer formed over the side wiring, and a second electrode faulted over the EL layer.

In the Structural Example 8, the second electrode 108a is provided so as to extend beyond an edge portion of the first electrode 103a and an edge portion of the side wiring 131a at the place where the insulating partition wall 107 is provided for the edge portion of the first electrode 103a and the edge portion of the side wiring 131a. The second electrode 108a is directly connected to the auxiliary wiring 132b. The auxiliary wiring 132b is directly connected to the first electrode 103b. Therefore, the second electrode 108a is directly connected to the first electrode 103b. Accordingly, the first light-emitting element 51 and the second light-emitting element 52 are connected in series to each other.

Consequently, the light-emitting unit with high driving voltage, in which the first light-emitting element 51 and the second light-emitting element 52 are connected in series, can be provided.

In FIG. 5D, the first electrode and the second electrode are electrically connected to each other through an auxiliary wiring and the side wiring. Therefore, by appropriately selecting materials of the auxiliary wiring and the side wiring, formation of an insulating oxide film and an increase in electrical resistance can be prevented.

The partition wall 107 is provided to cover the edge portion of the first electrode 103a and the edge portion of the side wiring 131a. Thus, a short circuit between the first electrode 103a and the second electrode 108a at a step portion formed at the edge portion of the first electrode 103a can be prevented, whereby the light-emitting unit with high reliability can be provided.

Examples of materials that can be used for each layer will be described below.

The same structures as those in the above embodiments can be used for structures of the substrate, the planarization layer, the light-emitting element, the partition wall, the auxiliary wiring, the sealing film, and the separation layer.

In addition, the first electrode and the second electrode are electrically connected to each other through the auxiliary wiring in the structure described in this embodiment. Therefore, an insulating oxide film is not formed at the interface between the first electrode and the second electrode, so that a single film of aluminum may be used for the second electrode.

[Side Wiring]

For a material of the side wiring, a single layer or a stacked layer using a material selected from copper (Cu), titanium (Ti), tantalum (Ta), tungsten (W), molybdenum (Mo), chromium (Cr), neodymium (Nd), scandium (Sc), or nickel (Ni) or an alloy material including any of these materials as its main component is used. Aluminum can also be used for the material of the side wiring; however, in that case, it is preferable that the side wiring have a stacked-layer structure so that the above-described corrosion might not occur, and aluminum be used for a layer which is not in contact with ITO or the like. The side wiring has a property of transmitting light emitted from a light-emitting organic compound. The thickness of the side wiring can be greater than or equal to 3 nm and less than or equal to 30 nm, preferably greater than or equal to 5 nm and less than or equal to 15 nm.

This embodiment can be freely combined with other embodiments.

Embodiment 4

In this embodiment, a method for manufacturing the light-emitting unit of one embodiment of the present invention described in any of the above embodiments will be described with reference to FIGS. 6A to 6E and FIGS. 13A to 13C. Note that two adjacent light-emitting elements of the plurality of light-emitting elements connected in series which are described in FIGS. 1A and 1B are illustrated in FIGS. 6A to 6E for simplicity, and are described.

Structural Example 1

First, a conductive film for forming the wiring is formed over the substrate 100. The conductive film can be formed with the use of a film formation method such as a sputtering method. Then, a known semiconductor processing technique is used to remove unnecessary portions of the conductive film, so that the wiring 133a and the wiring 133b (see FIGS. 1A and 1B) are formed.

Next, the planarization layer 134 covering the wiring 133a and the wiring 133b is formed. There is no particular limitation on a method for forming the planarization layer 134, and the planarization layer 134 can be formed with the use of a method such as a sputtering method, an SOG method, spin coating, dipping, spray coating, a droplet discharge method (e.g., an inkjet method), a printing method (e.g., a screen printing method, or an off-set printing method), or with a tool (equipment) such as a doctor knife, a roll coater, a curtain coater, or a knife coater, depending on its material,. Then, openings each reaching the wiring 133a and the wiring 133b are formed (not shown).

Next, a conductive film connecting to the wiring 133a and the wiring 133b through the openings is formed, and then the first electrode 103b, the first electrode 103c, and the extraction electrode 160 (not shown) are faulted with the use of a known semiconductor processing technique.

Figure 6A:
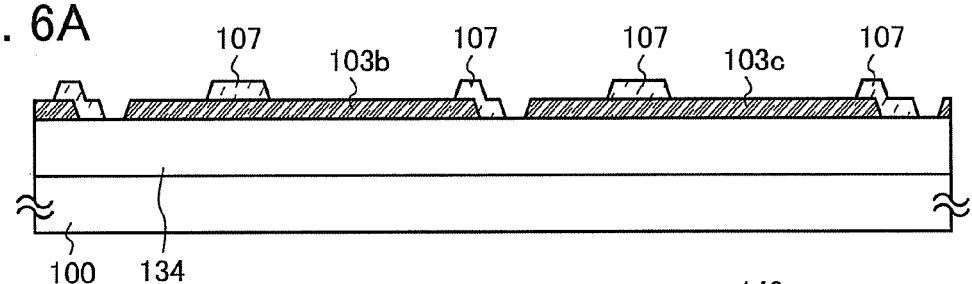
FIGS. 6A to 6E illustrate a method for manufacturing a light-emitting unit of one embodiment of the present invention.

Then, the partition wall 107 covering one of an edge portion of the first electrode 103b and an edge portion of the first electrode 103c, and the partition wall 107 over the first electrode 103b and the first electrode 103c are formed at the same time (FIG. 6A).

Next, the separation layer 139 is formed over the first electrode 103b and the first electrode 103c.

The separation layer 139 includes the leg portion 139a and the stage portion 139b. Here, the leg portion 139a and the stage portion 139b are formed so that the area of part of the leg portion 139a, which is in contact with the first electrode, is smaller than a projected area of the stage portion 139b. This processing is preferably performed through one patterning step.

Figure 6B:
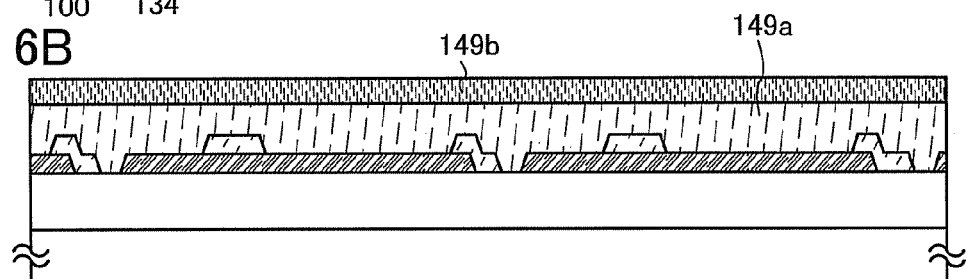

First, an insulating film 149a which is to be the leg portion later and an insulating film 149b which is to be the stage portion later are formed in this order (FIG. 6B).

In this embodiment, a negative type photosensitive organic resin film is used for the insulating film 149a and the insulating film 149b. For the insulating film 149a, a material with a lower photosensitivity to light used for light exposure than that of the insulating film 149b is used. The difference in these photosensitivities means that the diameter of a pattern of the insulating film 149a with a low photosensitivity becomes smaller than that of the insulating film 149b when the insulating films 149a and 149b are irradiated with light with the same intensity.

Figure 6C:
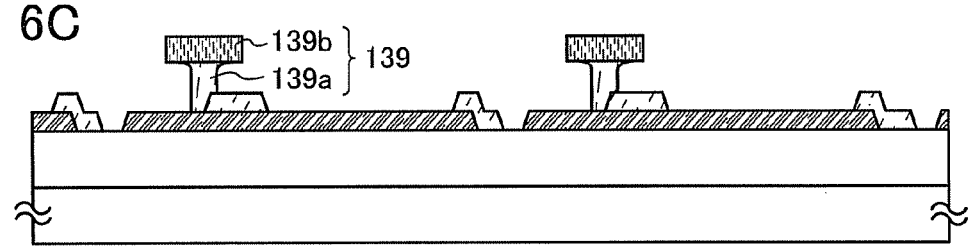

After the insulating film 149a and the insulating film 149b are formed, the insulating films 149a and 149b are selectively irradiated with light. Then, development treatment is performed, so that the separation layer 139 including the leg portion 139a and the stage portion 139b is formed (FIG. 6C). At this time, in the separation layer 139, because of the difference in the photosensitivities, an area in which the leg portion 139a is in contact with the first electrode is smaller than an area in which the stage portion 139b is projected on the first electrode.

Note that exposure treatment may be performed plural times. For example, exposure treatment may be performed twice with the use of two kinds of wavelength.

Figure 6D:
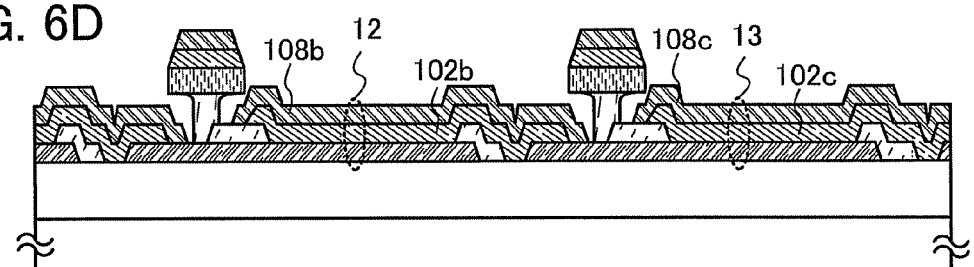

Next, the EL layer 102b, the EL layer 102c, the second electrode 108b, and the second electrode 108c are formed without the use of a metal mask (FIG. 6D). At this time, part of the EL layer which is formed is physically divided by the separation layer 139 to be electrically separated. Part of the second electrode which is formed is physically divided by the separation layer 139 to be electrically separated.

The second electrode is formed so that the second electrode enters a portion directly under the stage portion 139b that is a protruded portion of the separation layer 139 and covers the EL layer formed just before the second electrode. When the second electrode is formed in such a manner, an edge portion of the second electrode crosses over the EL layer and in contact with the first electrode directly under the stage portion 139b; thus, the second electrode is electrically connected to the first electrode. Further, the other edge portion of the second electrode is formed so as to be in contact with the partition wall 107 directly under the stage portion 139b.

For a film formation method of the EL layer, an evaporation method or the like can be used. For a film formation method of the second electrode, an evaporation method, a sputtering method, or the like can be used. As a sputtering method, other than a magnetron sputtering method, a mirrortron sputtering method is preferably used because the amount of entrance of the EL layer can be increased.

In order to form in the second electrode so as to cover the EL layer as described above, the distance between a deposition source and the substrate is set as appropriate. For example, when the distance between the deposition source and the substrate is large, the amount of the second electrode entering a region under the protruded portion of the stage portion 139b can be reduced. On the other hand, when this distance is small, the amount of the second electrode entering the region under the protruded portion of the stage portion 139b can be increased. Therefore, when forming the EL layer, the distance between the deposition source and the substrate is made large so that the amount of entrance of the EL layer is reduced. On the other hand, when forming the second electrode, the distance between the deposition source and the substrate is made small.

As described above, the second light-emitting element 12 and the third light-emitting element 13, which are connected in series, can be formed over the substrate 100.

Figure 6E:
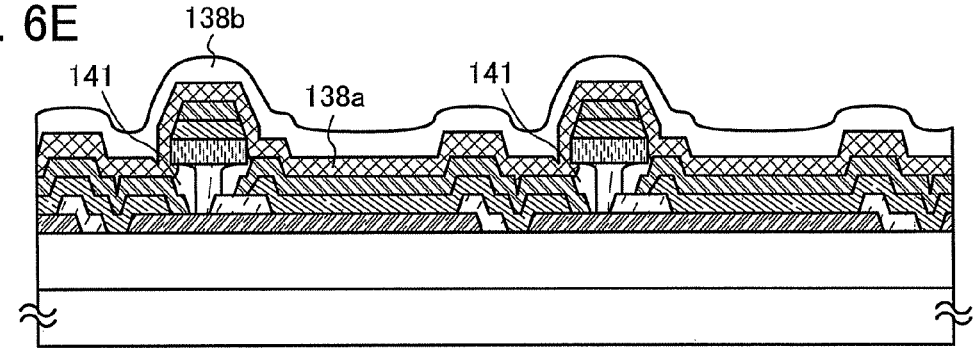

Next, the sealing film 138a and the sealing film 138b, which cover the whole components over the substrate 100 are formed (FIG. 6E). As the sealing film 138a, a film with a barrier property to an impurity such as moisture causing deterioration of the light-emitting element can be used. For example, an inorganic insulating film formed by a sputtering method can be used.

When the sealing film 138a is formed, the void 141 is formed in a region directly under the protruded portion of the stage portion 139b of the separation layer 139 in some cases. However, since the sealing film 138a is formed to cover the whole components over the substrate 100, the void 141 does not adversely affect the reliability of the light-emitting elements.

Further, the void 141 may be filled with a dry agent. For example, before the sealing film 138a is formed, a solution containing a dry agent is dropped to a region where the stage portion 139b overlaps with the substrate 100 by a droplet discharge method or the like, and dried. Here, it is preferable that a solvent for the solution, which is used, does not include moisture.

As the sealing film 138b, any of the sealing films described as an example in the above embodiment can be used as appropriate. For example, a film including an epoxy resin is bonded to the substrate 100 and subjected to thermocompression bonding, so that the sealing film 138b can be formed.

Note that in this embodiment, a method using two kinds of organic resin films having different photosensitivities is described as the formation method for the separation layer 139; however, other manufacturing methods can also be used.

For example, the insulating film 149a can be formed using an inorganic insulating film, and the insulating film 149b can be formed using a photosensitive organic film. First, exposure treatment, development treatment, and the like are performed and unnecessary portions of the insulating film 149b are removed; thus, the stage portion 139b is formed. Then, the stage portion 139b is used as a mask and the insulating film 149a is etched, so that the leg portion 139a is formed. At this time, conditions such as etching time or the like are adjusted as appropriate so that the projected area of the leg portion 139a, which is formed, is smaller than that of the stage portion 139b. For the etching of the insulating film 149a, a method which causes less damage to the exposed first electrode and the exposed partition wall due to etching is preferably used.

Alternatively, the insulating film 149a and the insulating film 149b are formed using a combination of inorganic materials with different etching rates. Typically, a combination of a silicon oxide film and a silicon nitride film is given; however, the combination is not limited to this, and a combination of films selected from an insulating film containing silicon, germanium, or the like; an organic insulating film; a metal oxide insulating film; and the like can be used as appropriate. First, a resist mask is formed over the insulating film 149b by a photolithography method, and the insulating film 149b is etched under a condition in which the etching rate of the insulating film 149b is low, so that the stage portion 139b is formed, and then the resist mask is removed. Then, the stage portion 139b is used as a mask, and the insulating film 149a is etched under a condition in which the etching rate of the film for forming the leg portion 139a is low; thus, the leg portion 139a is formed. The resist mask may be removed after the stage portion 139b is formed or after the leg portion 139a is formed, or the resist mask can be left without being removed and can remain. As for a method for etching, it is preferable to give consideration to damage to a lower layer due to etching as described above.

The insulating film 149a and the insulating film 149b may be formed using organic resin films having opposite photosensitivity. For example, the insulating film 149a can be formed using an organic resin film with a positive photosensitivity, and the insulating film 149b can be formed using an organic resin film with a negative photosensitivity. In this case, the insulating film 149a is formed and subjected to selective exposure treatment, development treatment, heat treatment, and the like; thus, the leg portion 139a is formed. Next, the insulating film 149b is formed and subjected to selective exposure treatment, development treatment, heat treatment, and the like; thus, the stage portion 139b is formed. Consequently, the separation layer 139 can be formed.

Further, an organic insulating film and an inorganic insulating film may be used as the insulating film 149a and the insulating film 149b, respectively. First, a stacked-layer film of the insulating film 149a and the insulating film 149b is formed, and the insulating film 149b is etched by a photolithography method, so that the stage portion 139b is formed. Next, the stage portion 139b is used as a hard mask, and the insulating film 149a is etched so as to be inversely tapered; thus, the leg portion 139a is formed. Here, when etching the insulating film 149a, dry etching is preferably used, in which case the shape of the leg portion 139a can be easily controlled.

The manufacturing method of the separation layer 139 is not limited to the above methods. As the insulating film 149a and the insulating film 149b, films selected from a nonphotosensitive organic film, a negative photosensitive organic film, a positive photosensitive organic film, an inorganic insulating film, and the like are combined as appropriate. In the above, the case where the separation layer 139 has a two-layer structure; however, the separation layer 139 can have a single-layer structure or a stacked-layer structure of two or more layers.

As described above, the separation layer 139 can be formed by a various manufacturing methods. Therefore, the separation layer 139 may have various shapes depending on a difference in the manufacturing methods. Hereinafter, features of a shape which can be used for the separation layer 139 will be described with reference to FIGS. 13A to 13C.

Figure 13A:
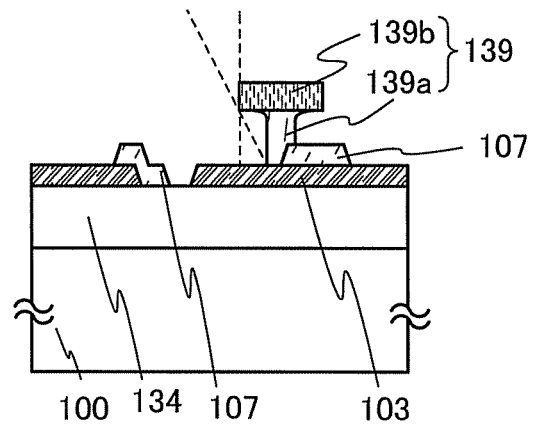
FIGS. 13A to 13C each illustrate a shape of a separation layer of one embodiment of the present invention.

The separation layer 139 illustrated in FIG. 13A includes the leg portion 139a and the stage portion 139b, which are formed of different insulating films. Cross-sections of the leg portion 139a and the stage portion 139b are substantially quadrangular, and when seen from the above, a projected area of the stage portion 139b is larger than an area of the leg portion 139a which is in contact with the first electrode 103. Note that an upper edge of the stage portion 139b may be rounded. An upper portion of the leg portion 139a is wide as illustrated in FIG. 13A.

Figure 13B:
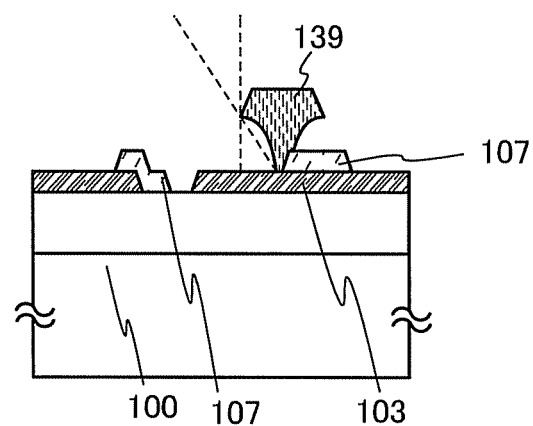

The separation layer 139 illustrated in FIG. 13B is formed of a single insulating film. In a cross section of the separation layer 139, a prism curves from the middle to the lower portion. Further, an upper portion of the prism protrudes horizontally to the lower portion. Note that an upper edge may be rounded as described above.

Figure 13C:
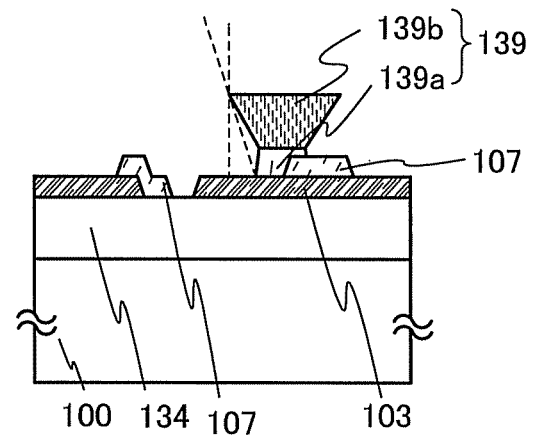

The separation layer 139 illustrated in FIG. 13C includes the leg portion 139a and the stage portion 139b, which are formed of different insulating films. Cross sections of the leg portion 139a and the stage portion 139b are substantially trapezoidal. When the separation layer 139 is seen from the above, a projected area of the bottom portion of the leg portion 139a is larger than that of the upper portion. On the other hand, the projected area of the bottom portion of the stage portion 139b is smaller than that of the upper portion. Moreover, there is a feature in that the area of the bottom portion of the leg portion 139a is smaller than the area of the upper portion of the stage portion 139b.

Here, the separation layer 139 illustrated in FIGS. 13A to 13C have the following common features. As shown by dashed lines in FIGS. 13A to 13C, in each of the separation layers, a space is provided on the leg portion side of a straight line connecting a point where the separation layer is most protruded and a point where a side surface of the separation layer is in contact with the first electrode 103. By providing such a restriction, a film formation method in which entrance of EL layer is prevented can be used when forming the EL layer, and a film formation method in which entrance of the second electrode is promoted can be used when forming the second electrode; therefore, the second electrode and the first electrode can be easily electrically connected to each other.

For the Structural Examples other than the Structural Example 1 described as examples in the above embodiment, a manufacturing method similar to that in the Structural Example 1 can be used. Differences in the manufacturing method between the Structural Example 1 and the other Structural Examples are given below.

Structural Example 2

The shape of the separation layer 139 in the Structural Example 2 (see FIGS. 3A and 3B) is different from that in the Structural Example 1. An organic film with a negative photosensitivity is formed and subjected to exposure treatment and development treatment, whereby the separation layer 139 can be formed. Here, the intensity of the exposure is adjusted so that the intensity decreases toward a lower portion of the organic film, whereby the influence of light entering a lower portion of the separation layer 139 is increased and the separation layer 139 can have a so-called inversely tapered shape.

Structural Example 3

The Structural Example 3 (see FIG. 4A) is different from the Structural Example 1. The partition wall 107 covers one edge portion of the first electrode 103a in the Structural Example 1; on the other hand, the partition wall 107 also covers the other edge portion of the first electrode 103b, which is adjacent to the first electrode 103a in the Structural Example 3. Therefore, when forming the partition wall 107, the partition wall 107 may be formed to have such a pattern.

Structural Examples 4 and 5

Structural Examples 4 and 5 (see FIGS. 4B and 4C) are greatly different from the Structural Example 1 in that the auxiliary wiring 132a and the auxiliary wiring 132b are provided. A conductive film is formed before the formation of the first electrode, and unnecessary portions of the conductive film are removed with the use of a semiconductor processing technique; thus, the auxiliary wiring 132a and the auxiliary wiring 132b are formed. The conductive film can be formed by a film formation method such as a sputtering method or the like using any of the materials given as examples in the above embodiment. In addition, the shape of the first electrode in the Structural Example 4 is different from a shape of the first electrode in the Structural Example 5. Therefore, the Structural Example 4 and the Structural Example 5 can be formed differently by using different patterns at the time of processing the first electrode.

Structural Examples 6 and 7

Structural Examples 6 and 7 (see FIGS. 5A and 5B) are greatly different from the Structural Example 1 in that the side wiring 131a and the side wiring 131b are included. For the side wiring 131a and the side wiring 131b, a second conductive film is successively formed when forming a first conductive film to be the first electrode. Then, the second conductive film is processed, so that the side wiring 131a and the side wiring 131b are formed when the first conductive film is processed to remove unnecessary portions, so that the first electrode is formed. Here, when the side wiring is provided in a lower portion of the first electrode, a conductive film to be the side wiring may be formed before a conductive film to be the first electrode is formed. Further, the shape of the partition wall 107 is different between the Structural Example 6 and the Structural Example 7 as in the Structural Example 1 and the Structural Example 3; therefore, the Structural Examples 6 and 7 can be formed differently in a manner similar to that in the Structural Examples 1 and 3.

Moreover, structures in FIGS. 5C and 5D can be formed by combining the manufacturing method of the auxiliary wiring 132a and the auxiliary wiring 132b described in the Structural Examples 4 and 5, and the manufacturing method of the side wiring 131a and the side wiring 131b described in the Structural Examples 6 and 7 as appropriate.

In the manufacturing method of this embodiment, a layer, in which two kinds of photosensitive resins having different photosensitivities are stacked, is subjected to selective exposure and development, whereby the separation layer 139 is formed. In addition, the EL layer is formed while entrance of the EL layer is prevented, and the second electrode is formed while entrance of the second electrode is promoted. In such a manner, the separation layer including the stage portion protruding over the second electrode beyond the leg portion can be easily formed. In addition, the layer containing a light-emitting organic compound is formed between the first electrode and the second electrode without the use of a metal mask, and the second electrode 108a and the first electrode 103b can be electrically connected to each other in a region where the second electrode overlaps with the stage portion.

Further, since a metal mask is not used in the manufacturing method, problems caused by damage of a surface of the substrate due to an edge of an opening in the metal mask can be prevented; thus, the light-emitting unit with high reliability can be provided. Moreover, since a metal mask is not used, there are effects of reducing a manufacturing cost and a maintenance cost such as cleaning.

This embodiment can be freely combined with other embodiments.

Embodiment 5

In this embodiment, a light-emitting unit of one embodiment of the present invention will be described with reference to FIG. 8A.

A light-emitting unit including an organic EL element emits light in a region where its refractive index is higher than the refractive index of the air. Thus, there is a condition under which total reflection occurs inside the light-emitting unit or at the boundary between the light-emitting unit and the air when light is extracted to the air, which causes a problem of a light extraction efficiency lower than 100%. It is generally said that the light extraction efficiency of the light-emitting unit is approximately 20% to 30%.

Specifically, in the case where the refractive index of a medium A is higher than the refractive index of a medium B and the refractive index of the medium B is lower than the refractive index of a layer containing a light-emitting organic compound, when light enters the medium B from the medium A, total reflection occurs in some cases depending on the incident angle.

At this time, it is preferable that an uneven structure be provided at the interface between the medium A and the medium B. Such a structure can suppress a phenomenon in which total reflection of light which enters the medium B from the medium A at an incident angle exceeding a critical angle occurs and the light propagates inside the light-emitting unit, which causes a reduction in the light extraction efficiency.

The light extraction efficiency of a light-emitting unit of one embodiment of the present invention described below can be approximately 1.2 times to 2 times higher than the light extraction efficiency of a light-emitting unit to which the present invention is not applied.

Modification Example 1

Figure 8A:
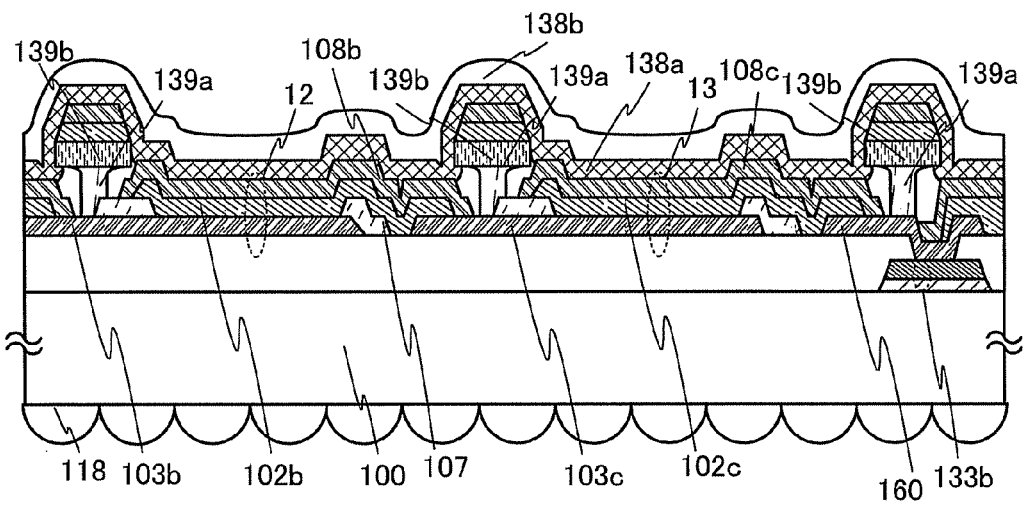
FIGS. 8A to 8C each illustrate a light-emitting unit of one embodiment of the present invention.

The light-emitting unit illustrated in FIG. 8A has the same structure as Structural Example 1 described in Embodiment 1 except for an uneven structure 118 provided on a surface of the substrate 100 on the side in contact with the air. The structural example which can be applied to Modification Example 1 is not limited to Structural Example 1. The structures described in the above embodiments can be employed as appropriate.

The refractive index of the substrate 100 is higher than the refractive index of the air; thus, total reflection occurs at the boundary between the substrate 100 and the air in some cases. In Modification Example 1, the uneven structure 118 is provided at the boundary between the air and the substrate 100, which makes it possible to reduce light which cannot be extracted due to the total reflection, so that the light extraction efficiency of the light-emitting unit can be increased.

[Uneven Structure]

The uneven structure 118 in a matrix is preferable although the uneven structure 118 in a striped formed is effective. There is no particular limitation on the pattern of the unevenness; for example, a shape with a vertex such as a circular cone, a pyramid (e.g., a triangular pyramid or a square pyramid), or an umbrella shape, or a hemisphere can be used.

It is preferable that the size and height of the unevenness be approximately greater than or equal to 0.1 µm and less than or equal to 1000 µm. In particular, the unevenness preferably has a size or height greater than or equal to 1 µm, in which case the influence of interference of light can be reduced. Note that the uneven structure may have a size or height exceeding 1000 µm.

A pattern in which unevenness is provided so that gaps are not formed between adjacent portions of the unevenness is preferably provided. For example, it is preferable that in the pattern, the unevenness is provided in a closest-packed manner. In the pattern, the unevenness may be formed over part of or an entire air-contact surface of the substrate. It is preferable that the unevenness be formed at least in a light-emitting region.

The uneven structure can be formed in such a manner that a hemispherical lens, a micro lens array, a resin provided with an uneven structure, a film provided with an uneven structure, a light diffusing film, or the like is bonded to the surface of the substrate with a known adhesive or the like.

Alternatively, an uneven structure may be formed directly on the substrate. As a method for forming an uneven structure directly on the substrate, for example, an etching method, a sand blasting method, a microblast processing method, a droplet discharge method, a printing method (screen printing or offset printing by which a pattern is formed), a coating method such as a spin coating method, a dipping method, a dispenser method, a nanoimprint method, or the like can be employed as appropriate.

In one embodiment of the present invention, the uneven structure is provided on the surface which is in contact with the air, whereby light which cannot be extracted to the air due to total reflection can be reduced, which results in an increase in the light extraction efficiency of the light-emitting unit.

This embodiment can be freely combined with any of the other embodiments.

Embodiment 6

In this embodiment, light-emitting units each of which is one embodiment of the present invention will be described with reference to FIGS. 8B and 8C.

The structure in which the first electrode of the light-emitting element is in contact with the planarization layer and, the planarization layer is in contact with the substrate is described in Embodiment 1 (e.g., FIGS. 1A and 1B). In general, the refractive index of a material used for a substrate (e.g., about 1.5 (refractive index of glass)) is lower than the refractive index of an EL layer (e.g., 1.6 or more). For that reason, when light enters the substrate from the first electrode through the planarization layer, the light is totally reflected in some cases. Thus, it is preferable that an uneven structure body be provided at a boundary with a condition under which the total reflection occurs.

However, when the first electrode is uneven, leakage current might be generated in the EL layer or the like formed over the first electrode.

In each of the light-emitting units described in this embodiment, an uneven structure body is provided over a substrate, a resin layer and a planarization layer are provided over the uneven structure body, and a first electrode is provided over the planarization layer; thus, the generation of leakage current in an EL layer or the like can be suppressed.

Moreover, when the uneven structure body is provided, light which cannot be extracted to the air due to total reflection at the boundary between the substrate and the resin layer can be reduced, which results in an increase in the light extraction efficiency of the light-emitting unit.

Further, when the resin layer and the planarization layer are each formed using a material whose refractive index is higher than the refractive index of the EL layer (in particular, a layer containing a light-emitting organic compound), a light-emitting unit in which total reflection is suppressed can be achieved.

Modification Example 2

Figure 8B:
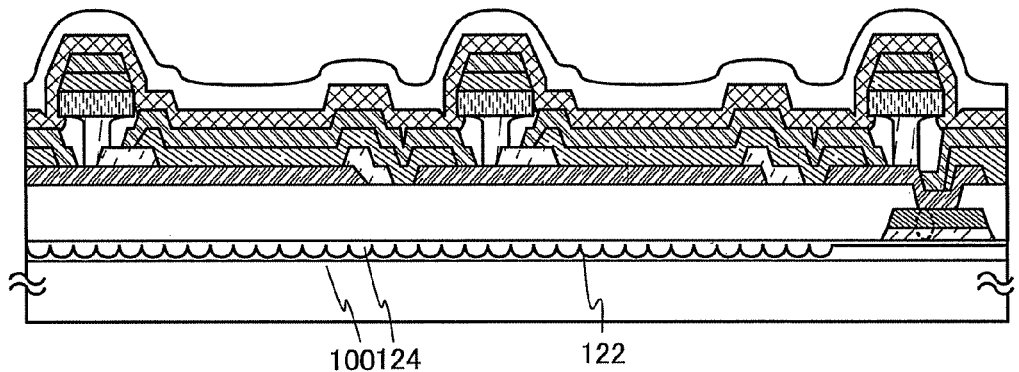

A light-emitting unit illustrated in FIG. 8B includes an uneven structure body 122 over the substrate 100. In addition, the light-emitting unit includes a resin layer 124 over the uneven structure body 122. Except for these, the light-emitting unit has the same structure as Structural Example 1 described in Embodiment 1. The structural example which can be applied to Modification Example 2 is not limited to Structural Example 1. The structures described in the above embodiments can be employed as appropriate.

In Modification Example 2, the refractive index of each of the planarization layer 134 and the resin layer 124 is higher than the refractive index of a layer containing a light-emitting organic compound included in the EL layer or the refractive index of the first electrode. Such a structure makes it possible to prevent total reflection at the interface between the resin layer 124 and the planarization layer 134 and the interface between the planarization layer 134 and the first electrode.

In Modification Example 2, the refractive index of the substrate 100 is lower than the refractive index of the layer containing a light-emitting organic compound included in the EL layer (e.g., 1.6 or more). Thus, there is a condition under which total reflection occurs at the interface between the substrate 100 and the resin layer 124.

In Modification Example 2, the uneven structure body 122 is provided over a surface where the substrate 100 is in contact with the resin layer 124. Such a structure can suppress a phenomenon in which total reflection of light which enters at an incident angle exceeding a critical angle occurs and the light propagates inside the light-emitting unit, which causes a reduction in the light extraction efficiency.

A protective film may be formed between the resin layer 124 and the first electrode. When the protective film is provided, moisture can be prevented from entering the EL layer from the resin layer 124; thus, a reduction in the lifetime of the light-emitting unit can be suppressed.

Figure 8C:
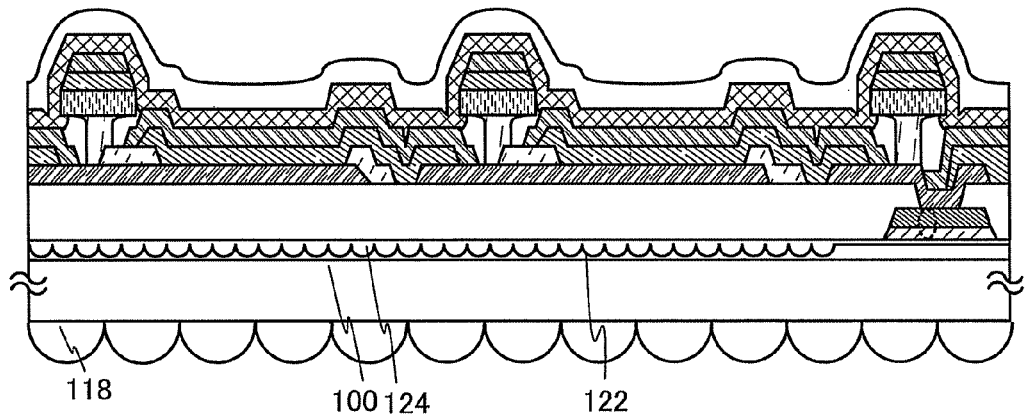

Note that FIG. 8C illustrates an example of a structure in which the uneven structure body 122 and the uneven structure 118 described in the above embodiment are combined.

[Resin Layer]

Examples of materials for the resin layer 124 include a liquid, a resin, and the like with a high refractive index. The resin layer 124 has a light-transmitting property. Examples of the resin with a high refractive index include a resin containing bromine and a resin containing sulfur. For example, a sulfur-containing polyimide resin, an episulfide resin, a thiourethane resin, and a brominated aromatic resin can be used. In addition, polyethylene terephthalate (PET), triacetyl cellulose (TAC), or the like can be used. As the liquid with a high refractive index, a contact liquid (refractive liquid) containing sulfur and methylene iodide, or the like can be used. Any of a variety of methods suitable for the material may be employed for forming the resin layer 124. For example, any of the above resins is deposited by a spin coating method and is cured by heat or light, so that the resin layer 124 can be formed. The material and the deposition method can be selected as appropriate in consideration of the adhesion strength, ease of processing, or the like.

[Planarization Layer]

The planarization layer 134 can be formed using any of the above resins with a high refractive index, which are given as the materials for the resin layer 124.

[Protective Film]

The protective film can be formed of a silicon nitride film, a silicon nitride oxide film, an aluminum nitride film, or the like.

[Uneven Structure Body]

The uneven structure body 122 can be Ruined in such a manner that a hemispherical lens, a micro lens array, a resin provided with an uneven structure, a film provided with an uneven structure, a light diffusing film, or the like is bonded to the surface of the substrate 100 with a known adhesive or the like. The uneven structure body can be formed directly on the substrate in a manner similar to that of the uneven structure.

The uneven structure body in a matrix is preferable although the uneven structure body 122 in a striped form is effective. There is no particular limitation on the pattern of the unevenness; for example, a shape with a vertex such as a circular cone, a pyramid (e.g., a triangular pyramid or a square pyramid), or an umbrella shape, or a hemisphere can be used.

It is preferable that the size and height of the unevenness be approximately greater than or equal to 0.1 μm and less than or equal to 1000 μm. In particular, the unevenness preferably has a size or height greater than or equal to 1 μm, in which case the influence of interference of light can be reduced. The size and height of the unevenness affect the usage amount of the material for the resin layer. The unevenness preferably has a size or height less than or equal to 100 μm, in which case the use of a large amount of materials for the resin layer can be reduced.

When the pattern of the unevenness is periodic in the uneven structure body 122 whose size is in the above range, the unevenness functions as a diffraction grating, so that an interference effect is increased and light with a certain wavelength: is easily extracted to the air. For that reason, it is preferable that the pattern of the unevenness be not periodic. Further, the pattern is formed at least in a light-emitting region.

In this embodiment, the uneven structure is provided, whereby total reflection of light which enters at an incident angle exceeding a critical angle and a reduction in the light extraction efficiency due to the propagation of the light inside the light-emitting unit can be suppressed.

This embodiment can be freely combined with other embodiments.

Embodiment 7

In this embodiment, one embodiment of a light-emitting device including any of the light-emitting units described as examples in the above embodiments will be described with reference to FIGS. 9A to 9C and FIGS. 10A and 10B.

Figure 9A:
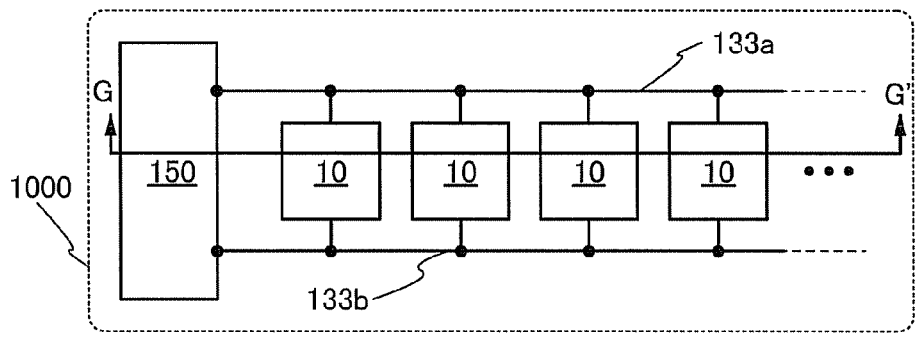
FIGS. 9A to 9C illustrate a light-emitting device of one embodiment of the present invention.

FIG. 9A is a schematic view of a structure of a light-emitting device 1000 that is one embodiment of the present invention.

The light-emitting device 1000 includes a converter 150 and a plurality of light-emitting units 10. The plurality of light-emitting units 10 are connected in parallel, and each of the light-emitting units 10 is connected to the wiring 133a and the wiring 133b, which are connected to the converter 150.

For the converter 150, for example, an AC-DC converter which converts a voltage output from an alternating-current power source for home use into a direct-current voltage, a DC-DC converter, or the like, can be used. Different voltages are output to the wiring 133a and the wiring 133b, which are connected to the converter 150. Current flows to the light-emitting units 10 by this voltage difference between the wiring 133a and the wiring 133b, so that the light-emitting units 10 emit light.

The number of the plurality of light-emitting units 10 connected in parallel may be set as appropriate depending on the output characteristics of the converter 150. The number of the light-emitting units 10 connected in parallel can increase as the amount of current that flows from the converter 150 increases.

Figure 9B:
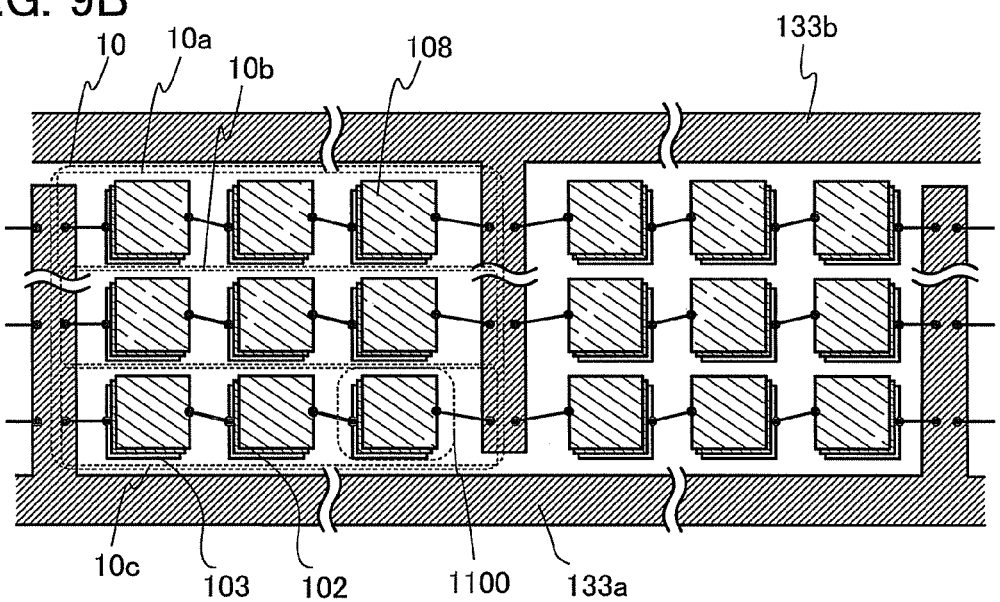
Figure 9C:
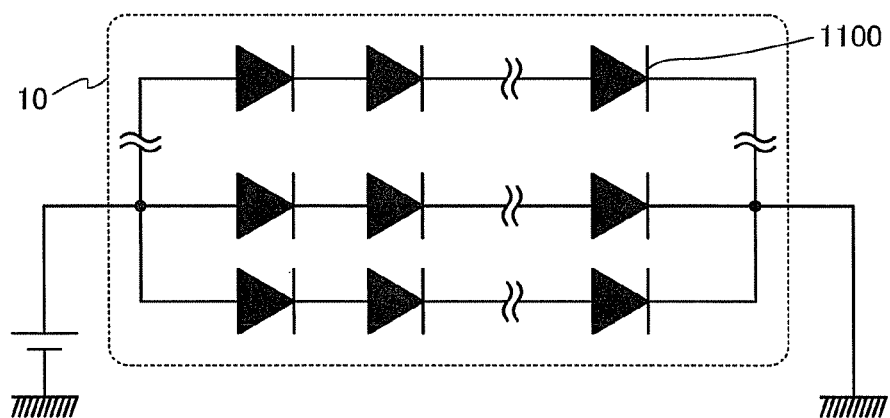

Next, a structure of the light-emitting unit 10 will be described with reference to FIGS. 9B and 9C. FIG. 9B is a schematic view illustrating the structure and the connection relation of the light-emitting units 10. FIG. 9C illustrates an equivalent circuit for describing the connection relations of a plurality of light-emitting elements 1100 in the light-emitting unit 10.

Light-emitting units 10a to 10c illustrated in FIG. 9B each include the plurality of light-emitting elements 1100 and each connect to the wiring 133a and the wiring 133b. In this embodiment, the light-emitting unit 10 with a structure in which the plurality of light-emitting elements 1100 are arranged in matrix in the row direction and the column direction, is described as an example. The number of the light-emitting elements 1100 provided in the light-emitting unit 10 may be set as appropriate depending on the output characteristics of the converter 150, a layout, or the like.

Any of the light-emitting elements described as examples in the above embodiments can be used as the light-emitting element 1100, and the light-emitting element 1100 includes the first electrode 103, the EL layer 102, and the second electrode 108.

The light-emitting elements 1100 are connected in series in the row direction. Specifically, the second electrode 108 in any of the light-emitting elements 1100 arranged in the row direction is connected to the first electrode 103 in the adjacent light-emitting element 1100, and this structure is repeated; thus, the light-emitting elements 1100 are connected in series. The two light-emitting elements 1100, which are connected in series, can be connected with the use of any of the methods and the structures described as examples in the above embodiments. In addition, groups each including the plurality of light-emitting elements 1100 connected in series are arranged in parallel in the column direction.

In FIG. 9B, the two light-emitting units 10 are provided symmetrically. With such a structure, the light-emitting units 10 can share part of the wiring 133a and part of the wiring 133b, which are connected to the light-emitting elements, so that a space between the light-emitting units 10 can be small; therefore, the area of light emission with respect to the area of the substrate can be large.

FIG. 9C illustrates the equivalent circuit showing the above-described connection relation. By connecting the groups, in each of which the light-emitting elements 1100 are connected in series, in parallel in such a manner, even in the case where one of the light-emitting elements 1100 in the light-emitting unit 10 is short-circuited, light can be emitted without blocking the flow of current through the other light-emitting elements.

In this embodiment, the groups each including the light-emitting elements connected in series are connected in parallel. However, a structure may be employed in which in the light-emitting elements adjacent to each other in the column direction, the first electrode and the second electrode of the light-emitting element are respectively connected to the first electrode and the second electrode of the adjacent light-emitting element, so that the light-emitting elements are connected in parallel in the column direction. As described above, with a connection relation combining a series connection and a parallel connection, even when one of the light-emitting elements 1100 in the light-emitting unit 10 is short-circuited or insulated, light can be emitted without blocking the flow of current through the other light-emitting elements 1100 adjacent to the light-emitting element 1100.

Figure 10A:
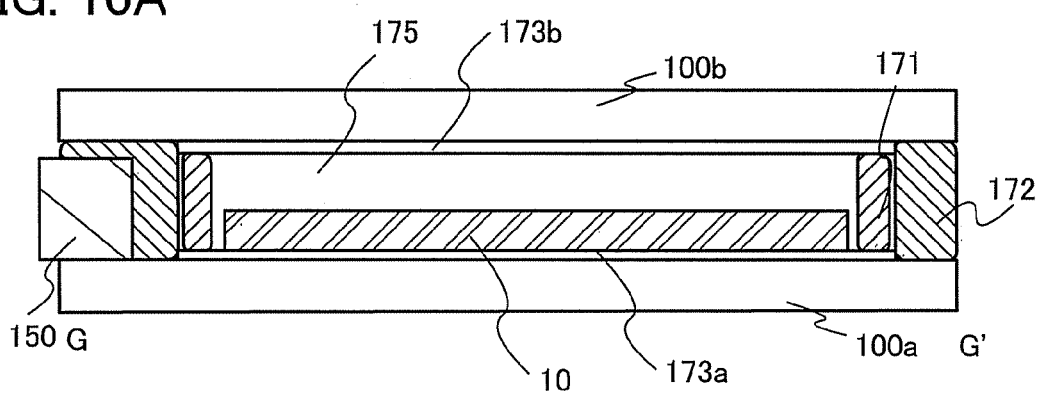
FIGS. 10A and 10B each illustrate a light-emitting device of one embodiment of the present invention.
Figure 10B:
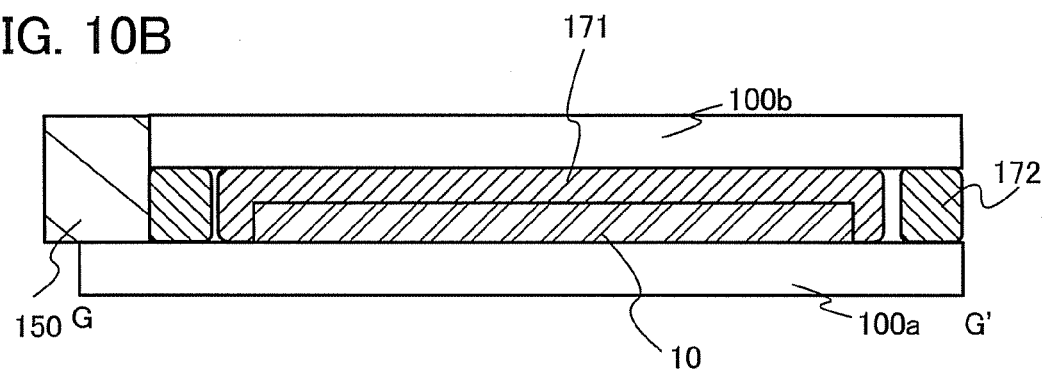

FIGS. 10A and 10B each illustrate a cross-sectional view along a line G-G' in FIG. 9A.

An example of a light-emitting device using an organic resin substrate as a substrate will be described with reference to FIG. 10A. (That is, a first substrate 100a in FIG. 10A corresponds to the substrate 100 illustrated in FIG. 1B and the like.) In the light-emitting device illustrated in FIG. 10A, a first glass layer 173a is formed over the first substrate 100a, and the plurality of light-emitting units 10 are provided over the first glass layer 173a. In FIG. 10A, the first glass layer 173a and a second glass layer 173b are bonded to each other with a sealant 171. In the light-emitting device illustrated in FIG. 10A, the light-emitting unit 10 is provided in a space 175 surrounded by the first glass layer 173a, the second glass layer 173b, and the sealant 171. The first substrate 100a and a second substrate 100b are bonded to each other with a sealant 172.

In the light-emitting device, the first substrate 100a and the second substrate 100b are preferably formed of the same organic resin material. When the same material is used for forming the first substrate 100a and the second substrate 100b, the occurrence of defective shape due to heat distortion or physical impact can be prevented. Therefore, the occurrence of deformation or breakage of the lighting device can be prevented at the time of manufacturing or using the light-emitting device.

An organic resin substrate and a glass layer are used in the light-emitting device of one embodiment of the present invention. For this reason, the light-emitting device can be reduced in weight. Moreover, the entry of moisture, an impurity, or the like from the outside of the light-emitting device to an organic compound or a metal material included in the light-emitting unit can be prevented.

An example of a light-emitting device using a glass substrate as a first substrate and using a metal substrate as a second substrate will be described with reference to FIG. 10B. (That is, the first substrate 100a in FIG. 10B corresponds to the substrate 100 illustrated in FIG. 1B and the like.) In the light-emitting device illustrated in FIG. 10B, the plurality of light-emitting units 10 are provided over the first substrate 100a. In FIG. 10B, the first substrate 100a and the second substrate 100b are bonded to each other with the sealant 171 and the sealant 172.

There is no particular limitation on a material of a metal substrate used as the second substrate, but it is preferable to use a metal such as aluminum, copper, or nickel, a metal alloy such as an aluminum alloy or stainless steel, or the like. There is no particular limitation on the thickness of the metal substrate. For example, a metal substrate with a thickness greater than or equal to 10 μm and less than or equal to 200 μm is preferably used, in which case the light-emitting device can be reduced in weight.

As the second substrate, a glass substrate, a quartz substrate, or the like can be used other than the metal substrate.

The converter 150 can be provided between the upper substrate and the lower substrate (FIG. 10A). Further, when the second substrate 100b is smaller than the first substrate 100a as illustrated in FIG. 10B, a thick converter can be provided without changing the thickness of the light-emitting device.

A space may be provided between the sealant 171 and the sealant 172. Alternatively, the sealant 171 and the sealant 172 may be in contact with each other.

[Space]

As a filler, an inert gas (such as nitrogen or argon) fills the space 175 (FIG. 10A). The space 175 can be filled with the sealant 171 (FIG. 10B). Further, in the light-emitting device in FIG. 10A, a filler that is different from the sealant 171 and the sealant 172 can be used to fill the space 175. When a material with low viscosity is used as a filler among the materials for a sealant, the space 175 can be easily filled.

[Sealant]

A known material can be used as the sealant. For example, a thermosetting material or a UV curable material may be used. A material capable of bonding glass is used for the sealant 171, and a material capable of bonding organic resins is used for the sealant 172. It is desirable that these materials transmit as little moisture or oxygen as possible. In addition, a sealant containing a dry agent can be used.

A dry agent may be introduced into the space 175. For example, a substance which absorbs moisture by chemical adsorption, such as an oxide of an alkaline earth metal (e.g., calcium oxide or barium oxide), can be used. Other than the above, a substance which adsorbs moisture by physical adsorption, such as zeolite or silica gel, may be used as the dry agent.

This embodiment can be freely combined with other embodiments.

Embodiment 8

In this embodiment, an example of an EL layer which can be applied to one embodiment of the present invention will be described with reference to FIGS. 11A to 11C.

Figure 11A:
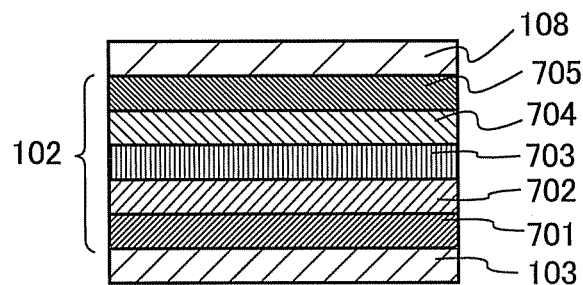
FIGS. 11A to 11C each illustrate an EL layer which can be used for one embodiment of the present invention.

As illustrated in FIG. 11A, the EL layer 102 is provided between the first electrode 103 and the second electrode 108. The first electrode 103 and the second electrode 108 can have structures similar to those in Embodiment 1.

In this embodiment, in the EL layer 102, a hole-injection layer 701, a hole-transport layer 702, a layer 703 containing a light-emitting organic compound, an electron-transport layer 704, and an electron-injection layer 705 are stacked in this order from the first electrode 103 side.

A manufacturing method of the light-emitting element illustrated in FIG. 11A will be described.

The hole-injection layer 701 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$), or copper(II) phthalocyanine (abbreviation: CuPc) can also be used.

Alternatively, the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenyl amino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacryla mide] (abbreviation: PTPDMA), and poly[N,N-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, excellent hole injection from the first electrode 103 can be obtained, which results in a reduction in the driving voltage of the light-emitting element. Such a composite material can be formed by co-evaporation of a substance having a high hole-transport property and a substance having an acceptor property. When the hole-injection layer 701 is formed using the composite material, holes are easily injected from the first electrode 103 into the EL layer 102.

As the organic compound for the composite material, various compounds such as an aromatic amine compound, carbazole derivatives, aromatic hydrocarbon, and a high molecular compound (such as oligomers, dendrimers, or polymers) can be used. The organic compound used for the composite material is preferably an organic compound having a high hole-transport property. Specifically, a substance having a hole mobility of $10^{-6}$ cm$^2$/Vs or higher is preferably used. It is to be noted that a substance other than the above may be used as long as it has a higher hole transport property than an electron transport property. The organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Further, it is possible to use the following aromatic hydrocarbon compounds: 2-tert-butyl-9,10-di(2-naphthypanthracene (abbreviation: t-BuDNA), 2-tert-butyl-9,10-di(1-naphthyl)anthracene, 9,10-bis(3,5-diphenylphenypanthracene (abbreviation: DPPA), 2-tert-butyl-9,10-bis(4-phenylphenypanthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthypanthracene, or the like.

Furthermore, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

As the electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

Note that the hole injection layer 701 may be formed using a composite material of the high molecular compound such as PVK, PVTPA, PTPDMA, or Poly-TPD, and the electron acceptor.

The hole-transport layer 702 is a layer containing a substance with a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^6$ cm$^2$/V·s or higher. It is to be noted that a substance other than the above may be used as long as it has a higher hole transport property than an electron transport property. The layer containing a substance having a high hole transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can be used.

For the layer 703 containing a light-emitting organic compound, a fluorescent compound which exhibits fluorescence or a phosphorescent compound which exhibits phosphorescence can be used.

Examples of the fluorescent materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)tiphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of materials for red light emission include N,N,N',N'-tetrakis(4-methylphenyptetracene-5,11-diamine (abbreviation: p-mPhTD), 7,14-diphenyl-N,N,N',N'-tetrakis(4-methylphenyl)acenaphtho[1,2-α]fluoranthene-3,10-d iamine (abbreviation: p-mPhAFD), and the like.

The phosphorescent compounds that can be used for the layer 703 containing a light-emitting organic compound will be given. Examples of the materials that emit blue light include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. Examples of the materials that emit green light include tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include the following organometallic complexes: bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium (III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenyl)-3,3,3-trifluoroacetonato](monophenanthroline)europium(III) (abbreviation: Eu(TTA)$_3$(Phen)) exhibits light emission from a rare earth metal ion (electron transition between different multiplicities); therefore, such a rare earth metal complex can be used as a phosphorescent compound.

Note that the layer 703 containing a light-emitting organic compound may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryilium (II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthypanthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diypdiphenanthrene (abbreviation: DPNS), 9,9'-(stilbene-4,4'-diypdiphenanthrene (abbreviation: DPNS2), 3,3',3"-(benzene-1,3,5-triyptripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryptriphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization may be further added. In addition, NPB, Alq, or the like may be further added in order to transfer energy efficiently to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)](abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Examples of the materials that emit green light include poly (p-phenylenevinylene) (abbreviation: PPV), poly[(9,9-dihexylfluorene-2,7-diyl)-alt-co-(benzo[2,1,3]thiadiazole-4,7-diyl)](abbreviation: PFBT), poly[(9,9-dioctyl-2,7-divinylenfluorenylene)-alt-co-(2-methoxy-5-(2-ethylhexyloxy)-1,4-phenylene)], or the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis (N,N'-diphenylamino)-1,4-phenylene]}(abbreviation: CN-PPV-DPD), and the like.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron-transport layer 704 is a layer containing a substance with a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/V·s or higher. The electron transport layer is not limited to a single layer, and may be a stack of two or more layers containing any of the above substances.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 11B:
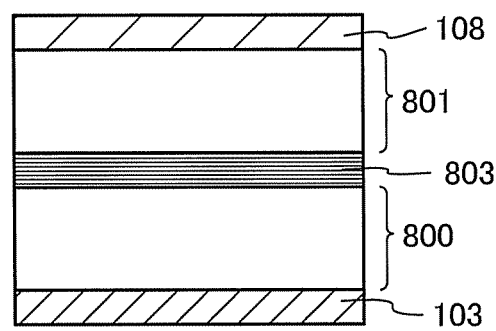

Note that a plurality of EL layers may be stacked between the first electrode 103 and the second electrode 108 as illustrated in FIG. 11B. In that case, a charge generation layer 803 is preferably provided between a first EL layer 800 and a second EL layer 801 which are stacked. The charge generation layer 803 can be formed by using the above-described composite material. Further, the charge generation layer 803 may have a stacked structure including a layer containing the composite material and a layer containing another material. In that case, as the layer containing another material, a layer containing an electron donating substance and a substance with a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be easily obtained. Note that this structure can be combined with the above-described structures of the EL layer.

Furthermore, by making emission colors of EL layers different, light of a desired color can be obtained from the light-emitting element as a whole. For example, the emission colors of first and second EL layers are complementary in a light-emitting element having, the two EL layers, so that the light-emitting element can be made to emit white light as a whole. Further, the same applies to a light-emitting element having three or more EL layers.

Figure 11C:
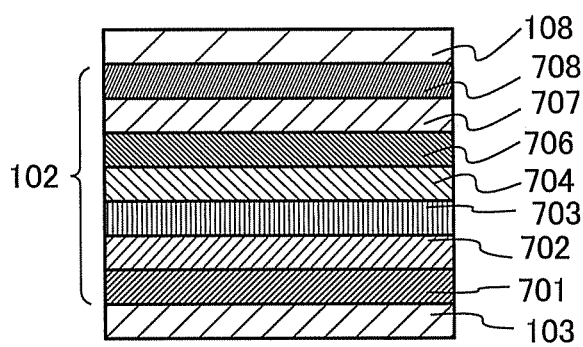

As illustrated in FIG. 11C, the EL layer 102 may include, between the first electrode 103 and the second electrode 108, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 108.

It is preferable to provide the composite material layer 708 which is in contact with the second electrode 108, in which case damage caused to the EL layer 102 particularly when the second electrode 108 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

For the electron-injection buffer layer 706, a substance having a high electron-injection property, such as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate) can be used.

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Examples of the donor substance include an organic compound such as tetrathianaphthacene (abbreviation: TTN), nickelocene, and decamethylnickelocene, in addition to an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and carbonate), and a rare earth metal compound (e.g., an oxide, a halide, and carbonate)). Note that as the substance having a high electron-transport property, a material similar to the material for the electron transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in driving voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the followings is preferably used: CuPc, phthalocyanine tin(II) complex (SnPc), phthalocyanine zinc complex (ZnPc), cobalt(II) phthalocyanine, β-formed (CoPc), phthalocyanine iron (FePc), and vanadyl 2,9,16,23-tetraphenoxy-29H,31H-phthalocyanine (PhO-VOPc).

As the metal complex which has a metal-oxygen bond and an aromatic ligand and is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. Thus, a phthalocyanine derivative has an advantage of being easily handled during formation of the light-emitting element and an advantage of facilitating maintenance of an apparatus used for forming a film.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following are given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Other than the above, 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5'-dihydro-2,2':5',2"-terthiophene) (abbreviation: DCMT), methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the above-described materials.

In the above manner, the EL layer 102 of this embodiment can be manufactured.

This embodiment can be freely combined with other embodiments.

Embodiment 9

In this embodiment, an example of a lighting device including the light-emitting unit of one embodiment of the present invention will be described with reference to FIGS. 12A and 12B.

In this embodiment, a lighting device whose light-emitting portion has a curved surface can be provided.

One embodiment of the present invention can be used for lighting in a car; for example, lighting can be provided for a dashboard, ceiling, or the like.

Figure 12A:
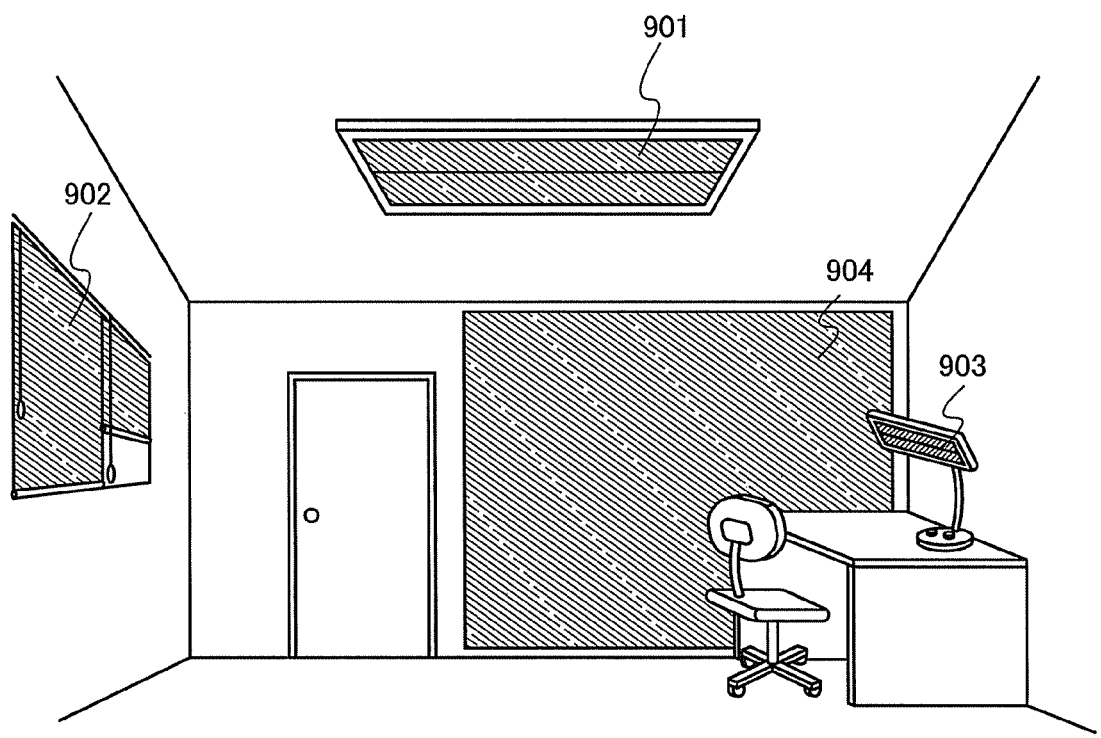
FIGS. 12A and 12B illustrate lighting devices of one embodiment of the present invention.

FIG. 12A illustrates an interior lighting device 901, a desk lamp 903, and a planar lighting device 904 to which one embodiment of the present invention is applied. The area of the light-emitting device can be increased, and therefore can be used as a large-area lighting device. Further, since the light-emitting device is thin, the light-emitting device can be mounted on a wall. Furthermore, the light-emitting device can be used as a roll-type lighting device 902.

Figure 12B:
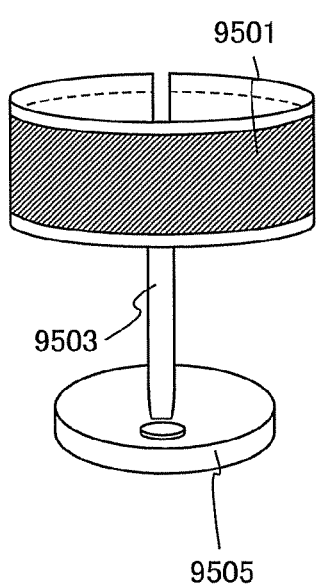

FIG. 12B illustrates another example of the lighting device. A desk lamp illustrated in FIG. 12B includes a lighting portion 9501, a support 9503, a support base 9505, and the like. The lighting portion 9501 includes the light-emitting unit of one embodiment of the present invention. As described above, in one embodiment of the present invention, a lighting device having a curved surface or a lighting device having a flexible lighting portion can be provided. The use of a flexible light-emitting unit for a lighting device as described above not only improves the degree of freedom in design of the lighting device but also enables the lighting device to be mounted onto a portion having a curved surface, such as the ceiling or a dashboard of a car.

This embodiment can be freely combined with other embodiments.

EXPLANATION OF REFERENCE

10: light-emitting unit, 10a: light-emitting unit, 10b: light-emitting unit, 10c: light-emitting unit, 11: first light-emitting element, 12: second light-emitting element, 13: third light-emitting element, 21: first light-emitting element, 22: second light-emitting element, 31: first light-emitting element, 32: second light-emitting element, 41: first light-emitting element, 42: second light-emitting element, 51: first light-emitting element, 52: second light-emitting element, 100: substrate, 100a: first substrate, 100b: second substrate, 102: EL layer, 102a: EL layer, 102b: EL layer, 102c: EL layer, 103: first electrode, 103a: first electrode, 103b: first electrode, 103c: first electrode, 107: partition wall, 108: second electrode, 108a: second electrode, 108b: second electrode, 108c: second electrode, 118: uneven structure, 122: uneven structure body, 124: resin layer, 131a: side wiring, 131b: side wiring, 132: auxiliary wiring, 132a: auxiliary wiring, 132b: auxiliary wiring, 133a: wiring, 133b: wiring, 134: planarization layer, 138a: sealing film, 138b: sealing film, 139: separation layer, 139a: leg portion, 139b: stage portion, 141: void, 149a: insulating film, 149b: insulating film, 150: converter, 160: extraction electrode, 171: sealant, 172: sealant, 173a: first glass layer, 173b: second glass layer, 175: space, 701: hole-injection layer, 702: hole-transport layer, 703: layer containing an organic compound with a light-emitting property, 704: electron-transport layer, 705: electron-injection layer, 706: electron-injection buffer layer, 707: electron-relay layer, 708: composite material layer, 800: first EL layer, 801: second EL layer, 803: charge generation layer, 901: lighting device, 902: lighting device, 903: desk lamp, 904: planar lighting device, 1000: light-emitting device, 1100: light-emitting element, 9501: lighting portion, 9503: support, and 9505: support base.

This application is based on Japanese Patent Application serial no. 2010-293944 filed with Japan Patent Office on Dec. 28, 2010 and Japanese Patent Application serial no. 2011-022567 filed with Japan Patent Office on Feb. 4, 2011, the entire contents of which are hereby incorporated by reference.

The invention claimed is:

1. A light-emitting unit comprising:
a first light-emitting element over an insulating surface; a second light-emitting element over the insulating surface; a separation layer; a first partition wall; and a second partition wall,
the first light-emitting element comprising:
  a first electrode;
  a second electrode overlapping with the first electrode; and
  a first light-emitting layer between the first electrode and the second electrode,
the second light-emitting element comprising:
  a third electrode;
  a fourth electrode overlapping with the third electrode; and
  a second light-emitting layer between the third electrode and the fourth electrode,
wherein:
the first partition wall covers an edge portion of the first electrode;
the second partition wall is formed over the third electrode;
the first electrode and the third electrode are island-shaped;
the first electrode and the third electrode are formed from the same layer that is capable of transmitting light emitted by the first light-emitting layer;
the first partition wall and the second partition wall are formed from the same layer;
the second electrode and the fourth electrode are formed from the same layer;
the first light-emitting layer is at least partially in direct contact with each of a top surface of the first partition wall, a side surface of the first partition wall, a top surface of the third electrode, a side surface of the third electrode and a part of the insulating surface;
the part of the insulating surface is between the first partition wall and the third electrode;
the separation layer is formed over the third electrode;
the separation layer comprises a leg portion and a stage portion over the leg portion;
a projected area of the stage portion is larger than a projected area of the leg portion;
a first edge portion of the second partition wall is covered with the second light-emitting layer, and a second edge portion of the second partition wall is in direct contact with the separation layer;
the second electrode is configured to extend beyond the edge portion of the first electrode with the first partition wall interposed therebetween; and
the second electrode is electrically connected to the third electrode in a region overlapping with the stage portion.

2. The light-emitting unit according to claim 1, wherein in a cross section of the separation layer, a space is provided between the second electrode and the leg portion.

3. The light-emitting unit according to claim 1, further comprising:
a first side wiring configured to overlap with the first light-emitting layer and the second electrode, and to be in direct contact with the first electrode; and
a second side wiring configured to overlap with the second light-emitting layer and the fourth electrode, and to be in direct contact with the third electrode,
wherein:
the first side wiring comprises a metal with higher conductivity than the first electrode, and
the second side wiring comprises a metal with higher conductivity than the third electrode.

4. A light-emitting device comprising a converter, wherein the light-emitting unit according to claim 1 is driven by an output voltage of the converter.

5. A lighting device comprising the light-emitting unit according to claim 1 in a light-emitting portion.

6. The light-emitting unit according to claim 1, wherein:
the first light-emitting element comprises a wiring; and
the wiring is at least partially in direct contact with each of a side surface of the first light-emitting layer and a bottom surface of the third electrode.

7. A light-emitting unit comprising:
a first light-emitting element over an insulating surface; a second light-emitting element over the insulating surface; a separation layer; a first partition wall; and a second partition wall,
the first light-emitting element comprising:
  a first electrode;
  a second electrode overlapping with the first electrode; and
  a first light-emitting layer between the first electrode and the second electrode, the second light-emitting element comprising:
 a third electrode;
 a fourth electrode overlapping with the third electrode;
 a second light-emitting layer between the third electrode and the fourth electrode; and
 an auxiliary wiring electrically connected to the third electrode;
wherein:
the first partition wall covers an edge portion of the first electrode;
the second partition wall is formed over the third electrode;
the first electrode and the third electrode are island-shaped;
the first electrode and the third electrode are formed from the same layer that is capable of transmitting light emitted by the first light-emitting layer;
the first partition wall and the second partition wall are formed from the same layer;
the second electrode and the fourth electrode are formed from the same layer;
the first light-emitting layer is at least partially in direct contact with each of a top surface of the first partition wall, a side surface of the first partition wall, a top surface of the auxiliary wiring, a side surface of the auxiliary wiring and a part of the insulating surface;
the part of the insulating surface is between the first partition wall and the auxiliary wiring;
the separation layer overlaps with the auxiliary wiring and the third electrode;
the separation layer comprises a leg portion and a stage portion over the leg portion;
a projected area of the stage portion is larger than a projected area of the leg portion;
a first edge portion of the second partition wall is covered with the second light-emitting layer, and a second edge portion of the second partition wall is in direct contact with the separation layer;
the second electrode is configured to extend beyond the edge portion of the first electrode with the first partition wall interposed therebetween; and
the second electrode is electrically connected to the auxiliary wiring in a region overlapping with the stage portion.

8. The light-emitting unit according to claim 7,
wherein in a cross section of the separation layer, a space is provided between the second electrode and the leg portion.

9. The light-emitting unit according to claim 7, further comprising:
 a first side wiring configured to overlap with the first light-emitting layer and the second electrode, and to be in direct contact with the first electrode; and
 a second side wiring configured to overlap with the second light-emitting layer and the fourth electrode, and to be in direct contact with the third electrode,
wherein:
the first side wiring comprises a metal with higher conductivity than the first electrode, and
the second side wiring comprises a metal with higher conductivity than the third electrode.

10. A light-emitting device comprising a converter, wherein the light-emitting unit according to claim 7 is driven by an output voltage of the converter.

11. A lighting device comprising the light-emitting unit according to claim 7 in a light-emitting portion.

\* \* \* \* \*

UNITED STATES PATENT AND TRADEMARK OFFICE
CERTIFICATE OF CORRECTION

| | |
|---|---|
| PATENT NO. | : 9,041,026 B2 |
| APPLICATION NO. | : 13/337631 |
| DATED | : May 26, 2015 |
| INVENTOR(S) | : Shunpei Yamazaki |

It is certified that error appears in the above-identified patent and that said Letters Patent is hereby corrected as shown below:

In the Specification:

Column 1, Line 24; Change "faulted" to --formed--.

Column 12, Line 16; Change "portion, of" to --portion of--.

Column 17, Line 65; Change "faulted" to --formed--.

Column 19, Line 37; Change "3 preferably" to --3 µm, preferably--.

Column 20, Line 27; Change "portion, of" to --portion of--.

Column 21, Line 55; Change "be, prevented" to --be prevented--.

Column 22, Line 51; Change "faulted" to --formed--.

Column 24, Line 13; Change "faulted" to --formed--.

Column 25, Line 13; Change "form in the" to --form the--.

Column 30, Lines 2 to 3; Change "formed" to --form--.

Column 30, Line 51; Change "and, the" to --and the --.

Column 32, Line 17; Change "Ruined" to --formed--.

Column 32, Lines 43 to 44; Change "wavelength: is" to --wavelength is--.

Column 36, Line 7; Change "phenyl amino" to --phenylamino--.

Column 36, Line 19; Change "methacryla mide" to --methacrylamide--.

Column 36, Line 20; Change "[N,N-bis(" to --[N,N'-bis(--.

Column 37, Lines 2 to 3; Change "(2-naphthypanthracene" to --(2-naphthyl)anthracene--.

Column 37, Line 5; Change "diphenylphenypanthracene" to --diphenylphenyl)anthracene--.

Column 37, Line 6; Change "(4-phenylphenypanthracene" to --(4-phenylphenyl)anthracene--.

Column 37, Line 13; Change "(l-naphthypanthracene," to --(1-naphthyl)anthracene,--.

Column 37, Line 46; Change "$10^6$ cm$^2$/V·s" to --$10^{-6}$ cm$^2$/V·s--.

Signed and Sealed this
First Day of December, 2015

Michelle K. Lee
*Director of the United States Patent and Trademark Office*

CERTIFICATE OF CORRECTION (continued)
U.S. Pat. No. 9,041,026 B2

In the Specification:

Column 37, Line 66; Change "tiphenylamine" to --triphenylamine--.

Column 38, Line 18; Change "methylphenyptetracene" to --methylphenyl)tetracene--.

Column 38, Line 20; Change "d iamine" to --diamine--.

Column 38, Line 27; Change "pridinato" to --pyridinato--.

Column 39, Line 7; Change "thenyl)" to --thenoyl--.

Column 39, Line 27; Change "beryilium" to --beryllium--.

Column 39, Line 45; Change "naphthypanthracen" to --naphthyl)anthracene--.

Column 39, Line 48; Change "diypdiphenanthrene" to --diyl)diphenanthrene--.

Column 39, Line 50; Change "triyptripyrene" to --triyl)tripyrene--.

Column 39, Line 55; Change "anthryptriphenylamine" to --anthryl)triphenylamine--.

Column 40, Lines 23 to 24; Change "diphenyl amino)" to --diphenyl-amino)--.

Column 41, Line 45; Change "having, the" to --having the--.

Column 43, Line 5; Change "β-formed" to --β-form--.